(12) United States Patent
Chiu

(10) Patent No.: US 7,821,295 B1
(45) Date of Patent: Oct. 26, 2010

(54) METHODS AND SYSTEMS FOR IMPROVING A MAXIMUM OPERATING FREQUENCY OF A PLD HAVING A SHIFT REGISTER WITHIN AN EMBEDDED MEMORY BLOCK

(75) Inventor: Gordon Raymond Chiu, Richmond Hill (CA)

(73) Assignee: Altera Corporation, San Jose, CA (US)

( * ) Notice: Subject to any disclaimer, the term of this patent is extended or adjusted under 35 U.S.C. 154(b) by 22 days.

(21) Appl. No.: 12/413,404

(22) Filed: Mar. 27, 2009

(51) Int. Cl.
*G11C 7/00* (2006.01)
*G06F 7/38* (2006.01)
*H03K 19/173* (2006.01)

(52) U.S. Cl. ............... 326/38; 326/46; 365/189.12

(58) Field of Classification Search ............ 326/37, 326/38, 46, 47; 365/189.05, 189.12
See application file for complete search history.

(56) References Cited

U.S. PATENT DOCUMENTS

| | | | |
|---|---|---|---|
| 5,072,402 A | 12/1991 | Ashtaputre et al. | |
| 5,408,434 A | 4/1995 | Stansfield | |
| 5,452,010 A | 9/1995 | Doornink | |
| 5,457,482 A * | 10/1995 | Rhoden et al. | 345/548 |
| 6,191,609 B1 | 2/2001 | Chan et al. | |
| 6,490,717 B1 | 12/2002 | Pedersen et al. | |
| 6,763,506 B1 | 7/2004 | Betz et al. | |
| 7,000,137 B2 | 2/2006 | Silvaraman | |
| 7,051,312 B1 | 5/2006 | Rahut et al. | |
| 7,058,919 B1 | 6/2006 | Young et al. | |
| 7,088,136 B1 | 8/2006 | Lewis | |
| 7,088,606 B2 | 8/2006 | Turner | |
| 7,093,084 B1 | 8/2006 | Leblanc | |
| 7,120,883 B1 | 10/2006 | Van Antwerpen et al. | |
| 7,135,789 B2 | 11/2006 | Boros et al. | |
| 7,185,299 B1 | 2/2007 | Jayaraman | |
| 7,290,232 B1 | 10/2007 | Fung et al. | |
| 7,337,100 B1 | 2/2008 | Hutton et al. | |
| 7,360,190 B1 | 4/2008 | Singh et al. | |
| 7,412,680 B1 | 8/2008 | Gouterman et al. | |
| 7,444,613 B1 | 10/2008 | Chiu et al. | |
| 7,464,286 B1 | 12/2008 | Singh et al. | |
| 2007/0186199 A1 | 8/2007 | Frederikcson | |
| 2008/0218208 A1 | 9/2008 | Lewis et al. | |

* cited by examiner

*Primary Examiner*—Daniel D Chang
(74) *Attorney, Agent, or Firm*—Weaver Austin Villeneuve & Sampson LLP

(57) ABSTRACT

A method for improving a maximum operating frequency of an integrated circuit including a first shift register within a first random access memory (RAM) block is described. The method includes improving the maximum operating frequency by finding the first shift register implemented within the first RAM block.

21 Claims, 16 Drawing Sheets

METHODS AND SYSTEMS FOR IMPROVING A MAXIMUM OPERATING FREQUENCY OF A PLD HAVING A SHIFT REGISTER WITHIN AN EMBEDDED MEMORY BLOCK

FIELD OF THE INVENTION

The present disclosure generally relates to programmable logic device (PLD) integrated circuits and other devices of that general type. More particularly, the present invention relates to methods and systems for improving a maximum operating frequency of a PLD having a shift register within an embedded memory block.

BACKGROUND

PLDs are typically made up of a plurality of input/output (I/O) resources, a plurality of interconnect resources, a plurality of logic resources, and a plurality of memory resources. PLDs may also contain other resources, such as a plurality of digital signal processing blocks ("DSPs") and other embedded processing resources. The logic resources typically include logic elements ("LEs") grouped in clusters that are sometimes referred to as logic array blocks ("LABs"). The memory resources typically include embedded memory blocks (EMBs) of various sizes.

Modern PLDs include an increasing number of EMBs that may be used as on-chip memories. While the EMBs are used frequently in PLDs, the EMBs can be utilized more efficiently than they currently are to improve the PLDs.

SUMMARY OF THE INVENTION

In one aspect, a method for improving a maximum operating frequency of an integrated circuit including a first shift register within a first random access memory (RAM) block is described. The method includes improving the maximum operating frequency by finding the first shift register implemented within the first RAM block.

In another aspect, a system is described. The system includes a memory device and a processing unit coupled to the memory device. The processing unit is configured to improve a maximum operating frequency of an integrated circuit including the first shift register within the first RAM block. The processing unit is configured to improve the maximum operating frequency by finding the first shift register implemented within the first RAM block.

In yet another aspect, another system is described. The system includes an input device, the memory device coupled to the input device, and the processing unit coupled to the memory device. The processing unit is configured to improve a maximum operating frequency of an integrated circuit including the first shift register within the first random access memory RAM block.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION

Figure 1:
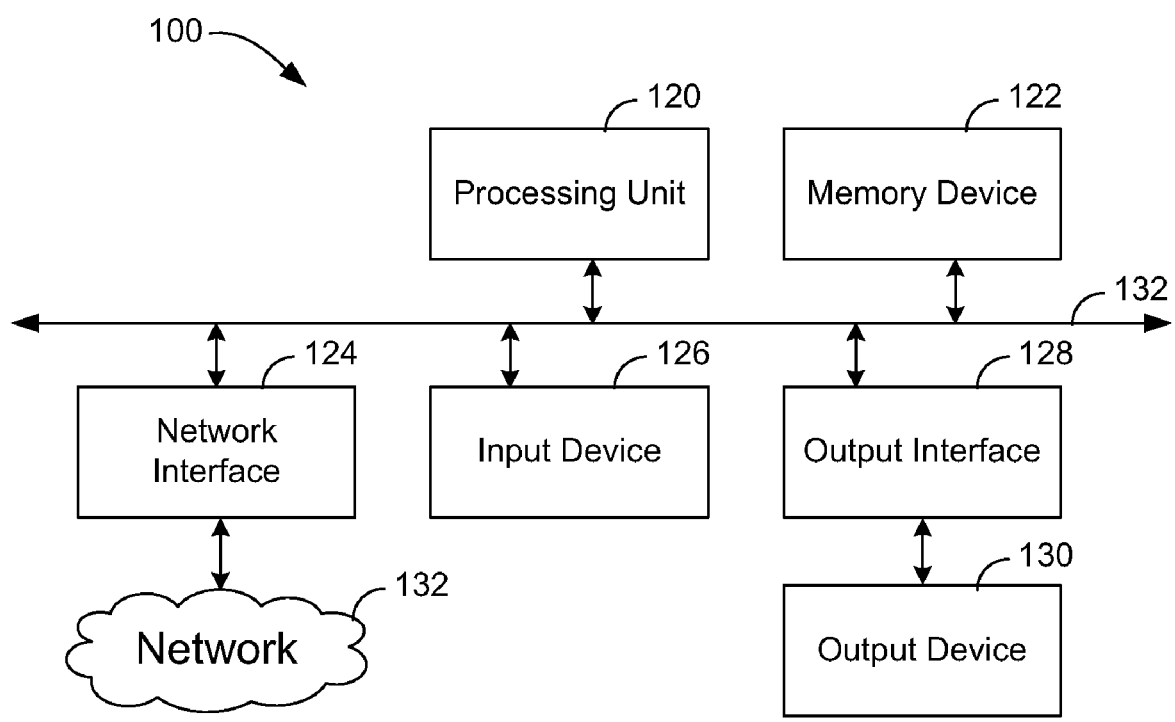
FIG. 1 is a block diagram of an embodiment of a system for improving a maximum frequency of an integrated circuit.

FIG. 1 is a block diagram of an embodiment of a system 100 for improving a maximum frequency of an integrated circuit, such as a programmable logic device (PLD). System 100 includes a processing unit 120, a memory device 122, a network interface 124, an input device 126, an output interface 128, and an output device 130.

Processing unit 120 may be a central processing unit (CPU), a microprocessor, a floating point coprocessor, a graphics coprocessor, a hardware controller, a microcontroller, a programmable logic device programmed for use as a controller, a network controller, or other processing unit. Memory device 122 may be a random access memory (RAM), a read-only memory (ROM), or a combination of RAM and ROM. For example, memory device 122 includes a computer-readable medium, such as a floppy disk, a ZIP™ disk, a magnetic disk, a hard disk, a compact disc-ROM (CD-ROM), a recordable CD, a digital video disc (DVD), or a flash memory. Memory device 122 stores the methods, described herein, for improving a maximum frequency of an integrated circuit.

Network interface 124 may be a modem or a network interface card (NIC) that allows processing unit 120 to communicate with a network 132, such as a wide area network (WAN) or a local area network (LAN). Processing unit 120 may be connected via a wireless connection or a wired connection to network 132. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 126 include a mouse, a keyboard, a stylus, or a keypad. Output device 130 may be a liquid crystal display (LCD) device, a plasma display device, a light emitting diode (LED) display device, or a cathode ray tube (CRT)

display device. Examples of output interface 128 include a video controller that drives output device 130 to display one or more images based on instructions received from processing unit 120. Processing unit 120 access the methods, described herein, for improving a maximum frequency of an integrated circuit, from memory device 122 or from a remote memory device, similar to memory device 122, via network 132, and executes the methods. Processing unit 120, memory device 122, network interface 124, input device 126, output interface 128, and output device 130 communicate with each other via a bus 132. In another embodiment, system 100 may not include input device 126 and/or network interface 124.

Figure 2:
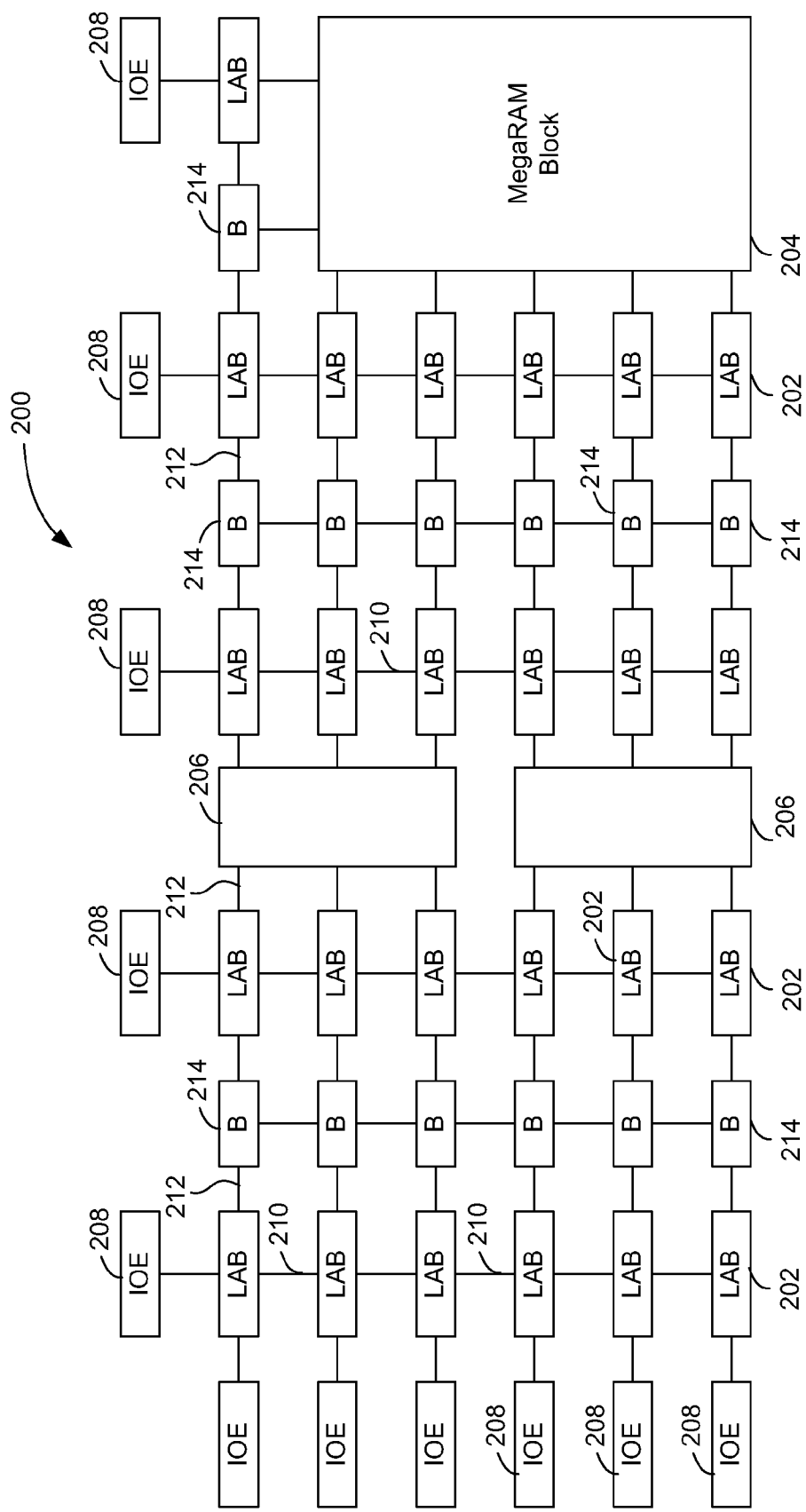
FIG. 2 is a block diagram of an embodiment of a programmable logic device (PLD) that is configured by using the system of FIG. 1.
Figure 3:
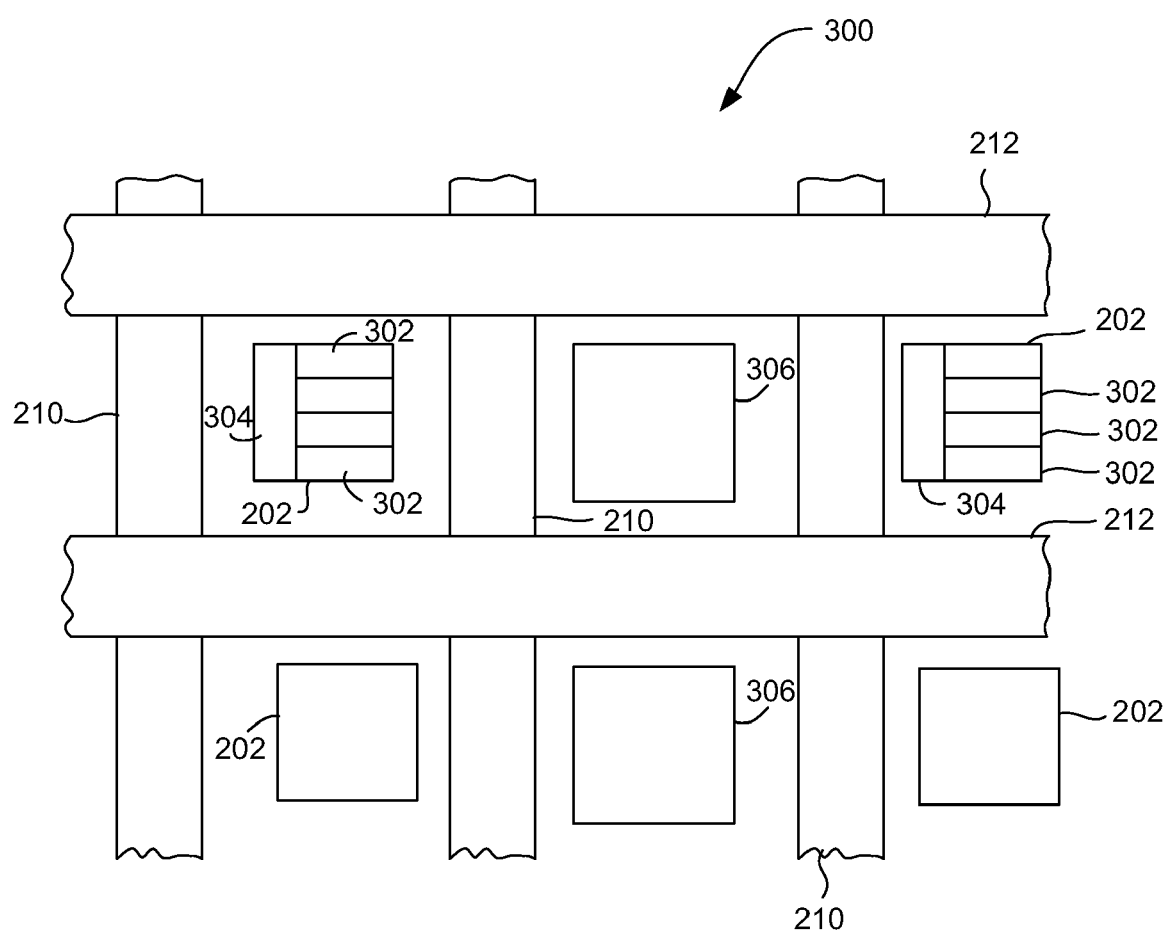
FIG. 3 is a block diagram of an embodiment of a portion of the PLD of FIG. 2.

FIG. 2 is a block diagram of an embodiment of a programmable logic device (PLD) 200 that is configured by using system 100 of FIG. 1, and FIG. 3 is a block diagram of an embodiment of a portion 300 of PLD 200. PLD 200 includes a two-dimensional array of programmable logic array blocks (LABs) 202 that are interconnected by a network of a plurality of column interconnects 210 and a plurality of row interconnects 212 of varying length and speed. For the purpose of avoiding clutter in FIG. 2, not all LABs are numbered 202. LABs 202 include multiple logic elements (LEs) 302 (shown in FIG. 3). PLD 200 also includes a distributed memory structure including a plurality of RAM blocks of varying sizes provided throughout the array. The RAM blocks include, for example, a MegaRAM block 204 providing 512 kilobits (K bits) of RAM or 900 K bits of RAM. PLD 200 further includes a plurality of digital signal processing (DSP) blocks 206 that can implement, for example, multipliers, add features, and/or subtract features. A plurality of input/output (I/O) elements (IOEs) 208 located around the periphery of PLD 200 support numerous single-ended and differential I/O standards. PLD 200 further includes a plurality of buffers (Bs) 214 that connect LABs 202. Buffers 214 may be used to store data that is transferred between LABs 202.

Referring to FIG. 3, PLD 200 includes a plurality of sets 304 of a plurality of LAB lines, LABs 202, and a plurality of embedded array blocks (EABs) 306. LEs 302 of LAB 202 are connected with each other via set 304 of LAB lines. Each EAB 306 includes a block of RAM, which is of a smaller size than MegaRAM block 204.

Figure 4:
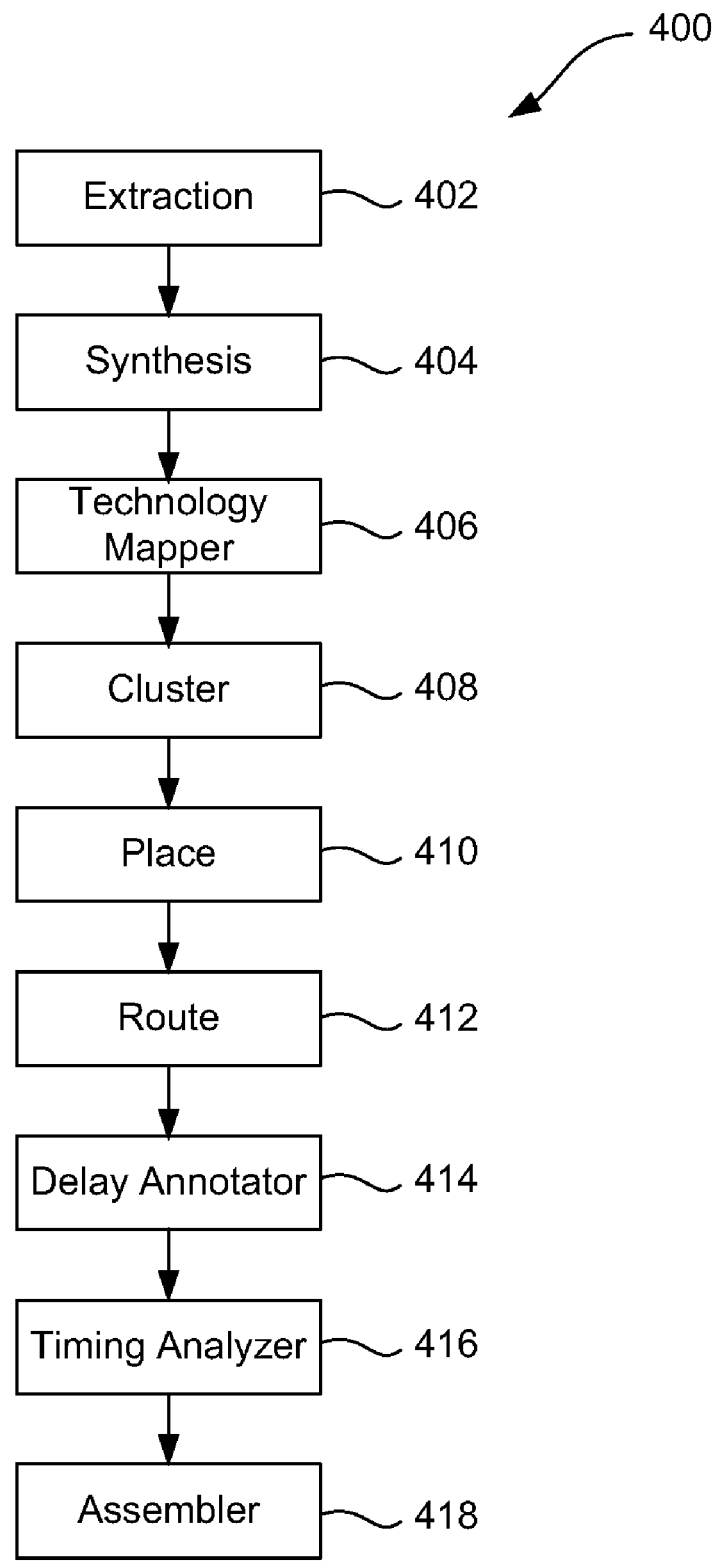
FIG. 4 is a block diagram of an embodiment of a method for improving a maximum frequency of an integrated circuit.

FIG. 4 is a block diagram of an embodiment of a method 400 for improving a maximum frequency of an integrated circuit. Method 400 is a compilation process that includes an extract phase 402, a synthesis phase 404, a technology mapping phase 406, a cluster phase 408, a place phase 410, a route phase 412, a delay annotator phase 414, a timing analysis phase 416, and an assembler phase 418. Processing unit 120 accesses method 400 stored within memory device 122 or the remote memory device, and executes the method.

Processing unit 120 executes the compilation process to convert a user design expressed, for example, as a Hardware Description Language (HDL) by a user, into a programmable device configuration to configure PLD 200 to implement the user design.

Processing unit 120 executes extract phase 402 to convert the user design into a register transfer layer description.

Processing unit 120 executes synthesis phase 404 to convert the register transfer layer description of the user design into a set of logic gates. Processing unit 120 executes technology mapping phase 406 to map the set of logic gates into a set of atoms, which are irreducible constituents of the user design. The atoms may correspond to groups of logic gates and other components of the user design matching the capabilities of LEs 302 or other functional blocks of PLD 200. The user design may be converted into any number of different sets of atoms, depending upon the underlying hardware of PLD 200 used to implement the user design.

Processing unit 120 further executes cluster phase 408 to group related atoms together into clusters. Processing unit 120 also executes place phase 410 to assign clusters of atoms to locations on PLD 200. Processing unit 120 executes route phase 4121 to determine a configuration of a configurable switching circuit of PLD 200 used to connect the atoms implementing the user design. Processing unit 120 executes delay annotator phase 414 to determine a plurality of signal delays, such as data delays, for the set of atoms and their associated connections in the configurable switching circuit by using a timing model of PLD 200. Processing unit 120 executes timing analysis phase 416 to determine whether the implementation of the user design in PLD 200 will meet a plurality of long-path and short-path timing constraints specified by the user via input device 126.

Processing unit 120 executes assembler phase 418 to generate configuration information specifying the configuration of PLD 200 implementing the user design, including the configuration of each LE 302 used to implement the user design and the configuration of the configurable switching circuit used to connect the LEs 302.

Processing unit 120 executes assembler phase 418 to write the configuration information to a configuration file, which can be stored within memory device 122 and can then be used to configure PLD 200 to implement instances of the user design.

In another embodiment, processing unit 120 executes a physical synthesis phase I between technology mapping phase 406 and cluster phase 408, and executes a physical synthesis phase II between place phase 410 and route phase 4121. During the physical synthesis phase I, processing unit 120 performs fast incremental placement of the atoms at a plurality of locations on PLD 200. During the physical synthesis phase II, processing unit 120 performs fast incremental placement of the clusters at a plurality of locations on PLD 200.

Figure 5:
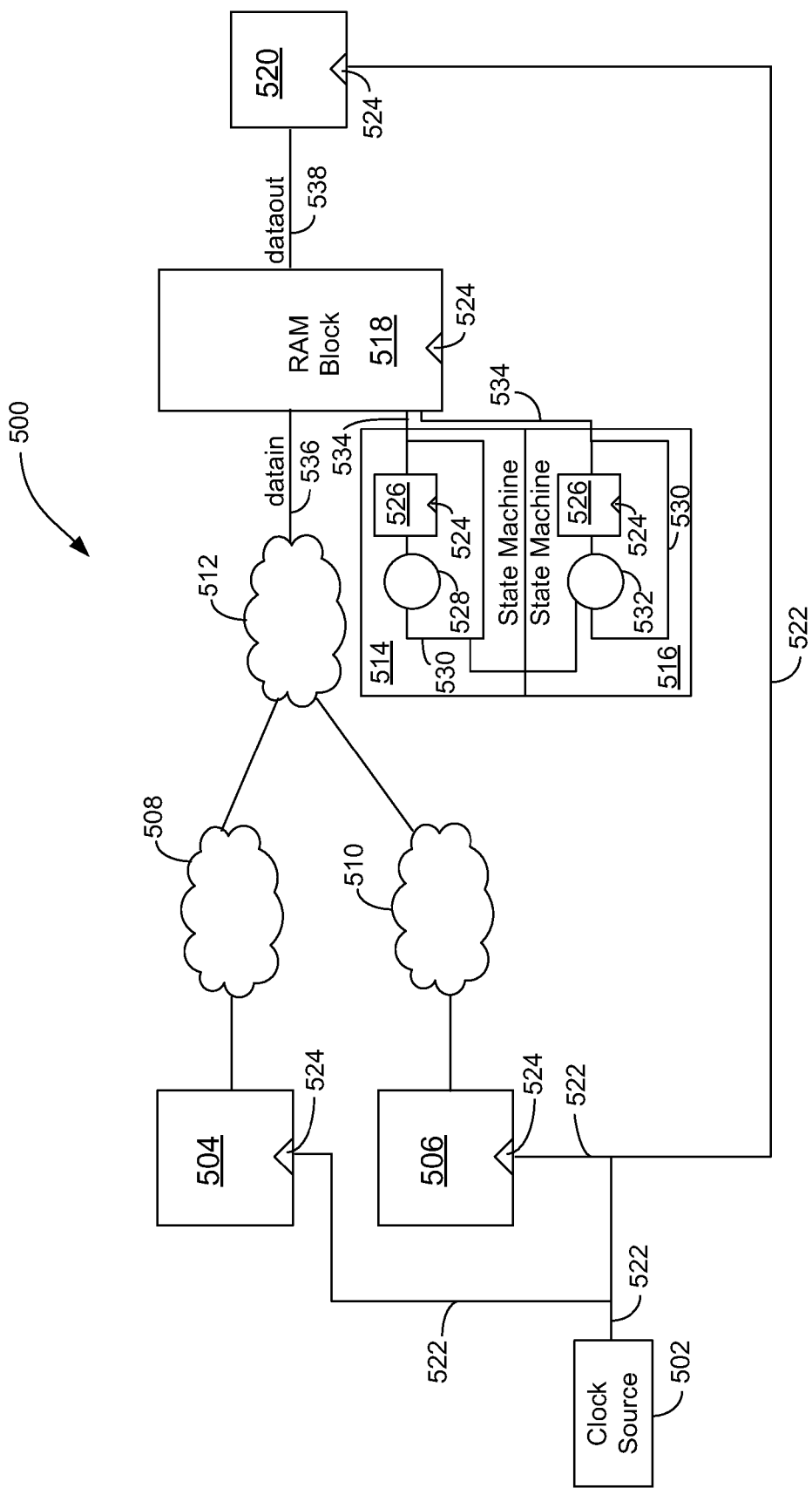
FIG. 5 is a block diagram of another embodiment of the PLD of FIG. 2.

FIG. 5 is a block diagram of an embodiment of a portion 500. Portion 500 is an example of PLD 200. Portion 500 includes a clock source 502, a plurality of source registers 504 and 506, a set of nodes 508, 510, and 512, a plurality of state machines 514 and 516, a RAM block 518, and a destination register 520. RAM block 518 is an example of MegaRAM block 204 or EAB 306. Each register 504, 506, and 520 may be a D flip-flop or a T flip-flop. Clock source 502 may be a crystal oscillator or a crystal oscillator coupled with a phase locked loop (PLL). Clock source 502 or a combination of clock source 502 and PLL may be referred to herein as a clock generator. Clock source 502 supplies a clock signal 522 to a clock input 524 of each register 504, 506, and 520, to clock input 524 of RAM block 518, and to clock input 524 of each state machine 514 and 516. Any of nodes 508, 510, and 512 may be a multiplier, an adder, or another device that performs another mathematical function.

State machine 514 includes a register 526, a combinational logic circuit 528, and a feedback loop 530. State machine 516 includes register 526, a combinational logic circuit 532, and feedback loop 530. Each state machine 514 and 516 does not receive a bit from a primary input and is initiated by a bit. After initiation, each state machine 514 and 516 does not receive a bit from a primary input. Combinational logic circuit 528 may be a gate, such as an AND gate, an OR gate, a NAND gate, a NOR gate, or a combination of the gates. Combinational logic circuit 532 may be a gate, such as an AND gate, an OR gate, a NAND gate, a NOR gate, or a combination of the gates.

Feedback loop 530 of state machine 514 is connected to a combinational logic circuit 532 of state machine 516. State machine 514 is connected to an address input 534 of RAM block 518 and state machine 516 is connected to another address input 534 of RAM block 518. Node 512 is connected to a data input 536 of RAM block 518 and destination register 520 is connected to a data output 538 of RAM block 518.

In another embodiment, portion 500 includes a higher or lower number of registers than that shown in FIG. 5, a higher or lower number of nodes than that shown in FIG. 5, a higher or lower number of RAM blocks than that shown in FIG. 5, and/or a higher or lower number of state machines than that shown in FIG. 5.

Figure 6:
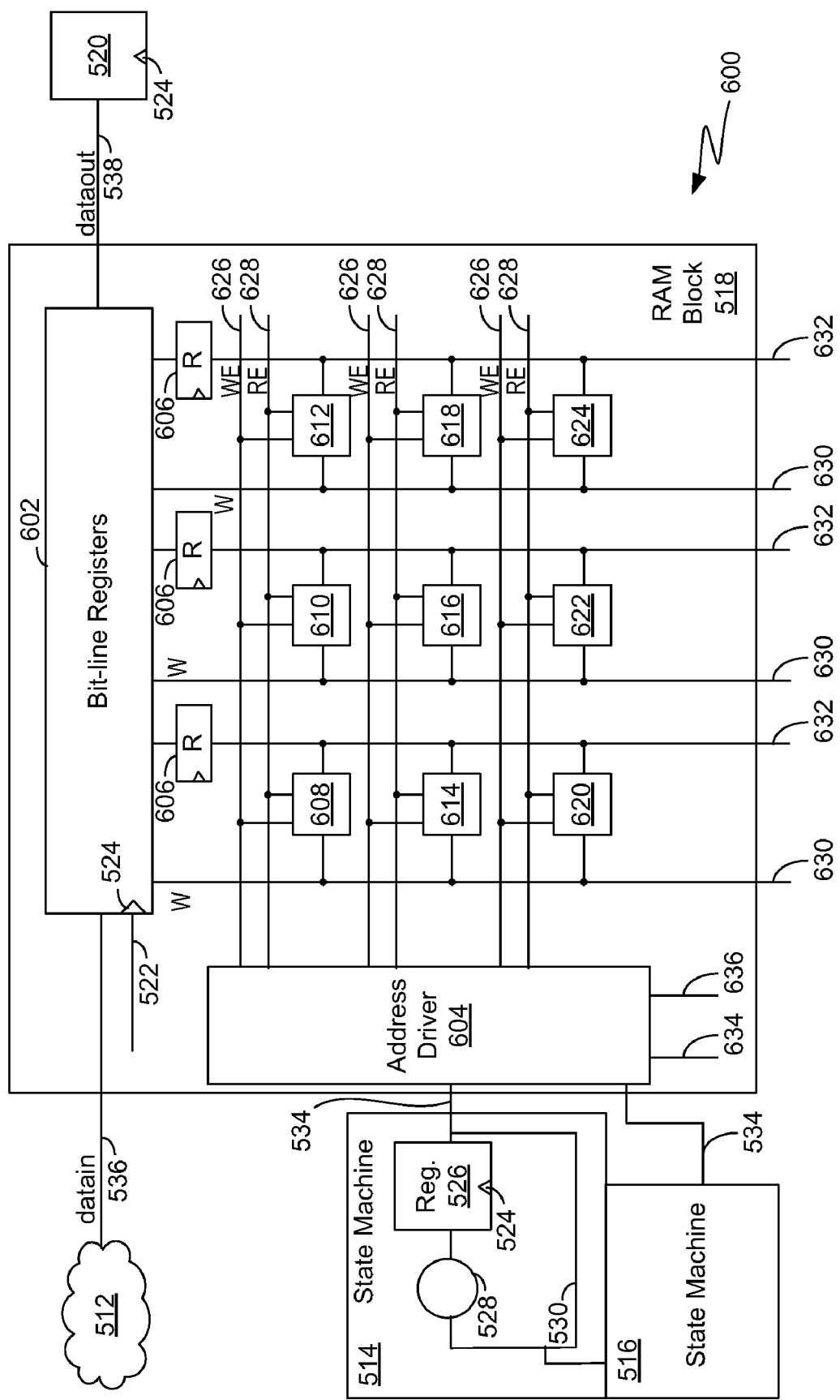
FIG. 6 is a block diagram of an embodiment of a system including a set of state machines and a random access memory (RAM) block of the portion of FIG. 5
Figure 7:
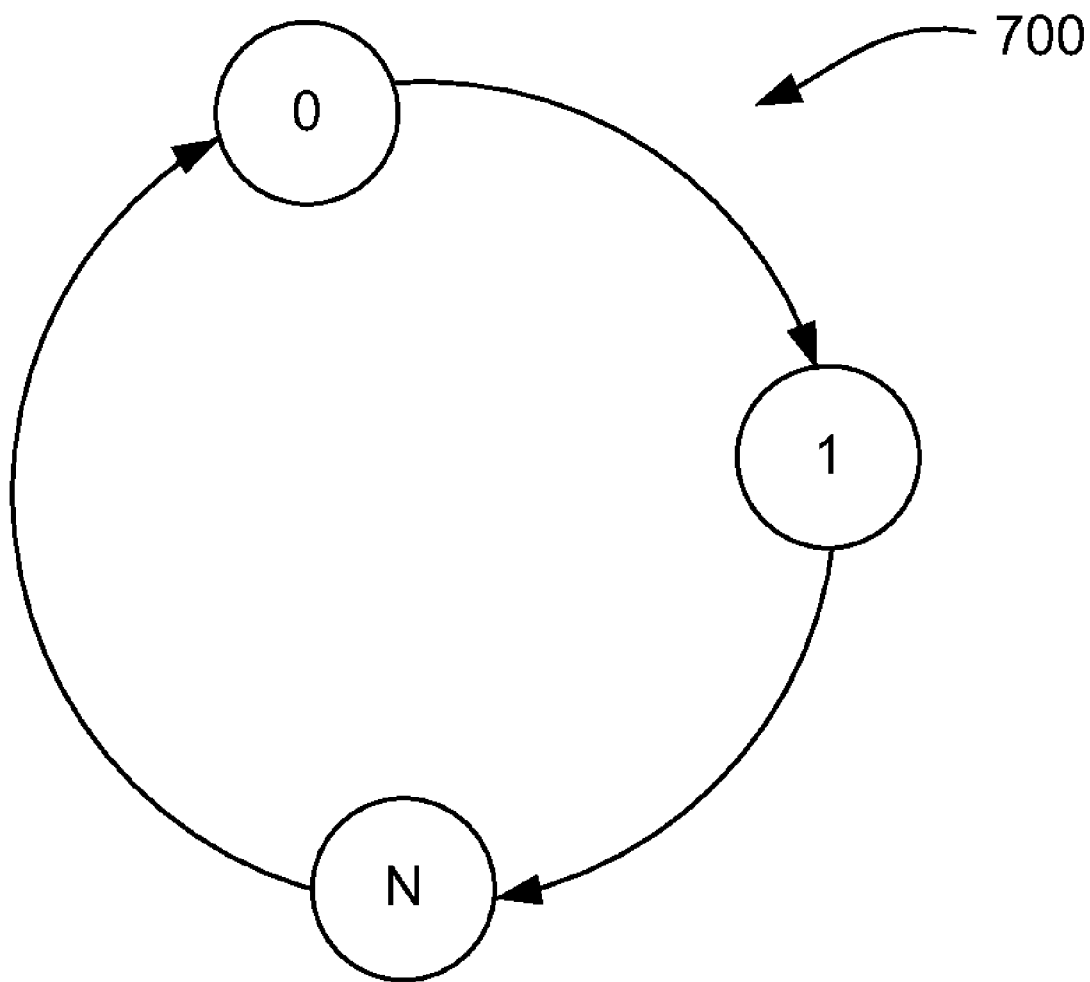
FIG. 7 is a state diagram illustrating a plurality of states 0, 1, N of the state machines of FIG. 6.

FIG. 6 is a block diagram of an embodiment of a system 600 including state machines 514 and 516 and RAM block 518, and FIG. 7 is a state diagram 700 illustrating a plurality of states 0, 1, N of state machines 514 and 516. N is a positive integer greater than zero. RAM block 518 includes a plurality of bit-line registers 602, an address driver 604, a plurality of read circuits 606, a plurality of memory cells 608, 610, 612, 614, 616, 618, 620, 622, and 624, a plurality of write enable (WE) lines 626, a plurality of read enable (RE) lines 628, a plurality of write data lines 630, and a plurality of data read lines 632. Address driver 604 may be a decoder. Each memory cell 608, 610, 612, 614, 616, 618, 620, 622, and 624 has the same structure as any of the remaining memory cells of system 600. Bit-line registers 602 may be a shift register and data received from node 512 is shifted through the shift register. Clock input 524 of bit-line registers 602 and of each read circuit 606 receives clock signal 522 from clock source 502. Each read circuit 606 includes a register, which may be a D flip-flop or a T flip-flop. Address driver 604 connects to address inputs 534, a read control line 634, and a write control line 636.

During a write cycle, state machines 514 and 516 start from state 0. A write cycle of state 0 may occur during a time period of clock signal 522. During a write cycle of state 0, combinational logic circuit 528 of state machine 514 supplies a bit having a value of 0 to register 526 of state machine 514. During a write cycle of state 0, register 526 of state machine 514 latches the bit having a value of 0 and outputs the bit at address input 534.

Further, during a write cycle of state 0, combinational logic circuit 532 of state machine 516 receives, via feedback loop 530, the bit having a value of 0 from state machine 514 to supply an additional bit having a value of 0 to register 526 of state machine 516. Register 526 of state machine 516 latches the additional bit in state 0 and outputs the additional bit to address driver 604.

Moreover, during a write cycle of state 0, write control line 636 is enabled and address driver 604 decodes bit address 00 generated by combining the bit having a value of 0 from state machine 514 and the additional bit having a value of 0 of state 0 to enable write enable line 626 corresponding to the bit address 00. During a write cycle of state 0, data input 536 to one of bit-line registers 602 is written, via write data line 630, to memory cell 608 having the bit address 00.

Further, during state 0, a read cycle is executed. A read cycle of state 0 may occur during a time period of clock signal 522. For example, a read cycle of state 0 occurs during half of a time period of clock signal 522 and a write cycle of state 0 occurs during the remaining half of the time period. As another example, a read cycle of state 0 occurs during one-third of a time period of clock signal 522 and a write cycle of state 0 occurs during the remaining two-thirds of the time period. During a read cycle of state 0, combinational logic circuit 528 of state machine 514 supplies a bit having a value of 0 to register 526 of state machine 514. During a read cycle of state 0, register 526 of state machine 514 receives the bit having a value of 0 from combinational logic circuit 528 and outputs the bit at address input 534.

Further, during a read cycle of state 0, combinational logic circuit 532 of state machine 516 receives, via feedback loop 530, a bit having a value of 0 in state 0 to supply a bit having a value of 1 to register 526 of state machine 516. During a read cycle of state 0, register 526 of state machine 516 latches the bit having a value of 1 in state 0 and outputs the bit to address driver 604.

Moreover, during a read cycle of state 0, read control line 634 is enabled and address driver 604 decodes bit address 01 generated by combining the bit having a value of 0 and the bit having a value of 1 of state 0 to enable read enable line 628 corresponding to the bit address 01.

Further, during a read cycle of state 0, data stored within memory cell 614 having the bit address 01 is read, via data read line 632 connected to the memory cell, by read circuit 606. Read circuit 606 latches data read from memory cell 614 having bit address 01 in state 0 and supplies the data to one of bit-line registers 602. Data provided from memory cell 614 having bit address 01 in state 0 to bit-line registers 602 is shifted out at data output 538 and transferred to destination register 520.

A write cycle of state 1 occurs during a time period of clock signal 522.

During a write cycle of state 1, combinational logic circuit 528 of state machine 514 supplies a bit having a value of 0 to register 526 of state machine 514. During a write cycle of state 1, register 526 of state machine 514 latches the bit having a value of 0 and outputs the bit at address input 534.

Further, during a write cycle of state 1, combinational logic circuit 532 of state machine 516 receives, via feedback loop 530, the bit having a value of 0 from state machine 514 to supply an additional bit having a value of 1 to register 526 of state machine 516. Register 526 of state machine 516 latches the additional bit in state 1 and outputs the additional bit to address driver 604.

Moreover, during a write cycle of state 1, write control line 636 is enabled and address driver 604 decodes bit address 01 generated by combining the bit having a value of 0 from state machine 514 and the additional bit having a value of 1 of state 1 to enable write enable line 626 corresponding to the bit address 01. During a write cycle of state 1, data input 536 into one of bit-line registers 602 is written, via write data line 630, to memory cell 614 having bit address 01.

Further, during state 1, a read cycle is executed. A read cycle of state 1 may occur during a time period of clock signal 522. For example, a read cycle of state 1 occurs during half of a time period of clock signal 522 and a write cycle of state 1 occurs during the remaining half of the time period. As another example, a read cycle of state 1 occurs during one-third of a time period of clock signal 522 and a write cycle of state 1 occurs during the remaining two-thirds of the time period. During a read cycle of state 1, combinational logic circuit 528 of state machine 514 supplies a bit having a value of 1 to register 526 of state machine 514. During a read cycle of state 1, register 526 of state machine 514 receives the bit having a value of 1 from combinational logic circuit 528 and outputs the bit at address input 534.

Further, during a read cycle of state 1, combinational logic circuit 532 of state machine 516 receives, via feedback loop 530, a bit having a value of 1 in state 1 to supply a bit having a value of 0 to register 526 of state machine 516. During a read cycle of state 1, register 526 of state machine 516 latches the bit having a value of 0 in state 1 and outputs the bit to address driver 604.

Moreover, during a read cycle of state 1, read control line 634 is enabled and address driver 604 decodes bit address 10 generated by combining the bit having a value of 1 and the bit having a value of 0 of state 1 to enable read enable line 628 corresponding to the bit address 10.

Further, during a read cycle of state 1, data stored within memory cell 620 having bit address 10 is read, via data read line 632 connected to the memory cell, by read circuit 606. Read circuit 606 latches data read from memory cell 620 having bit address 10 in state 1 and supplies the data to one of bit-line registers 602. Data provided from memory cell 620 having bit address 10 in state 1 to bit-line registers 602 is shifted out at data output 538 and transferred to destination register 520.

A write cycle of state N occurs during a time period of clock signal 522.

During a write cycle of state N, combinational logic circuit 528 of state machine 514 supplies a bit having a value of 1 to register 526 of state machine 514. During a write cycle of state N, register 526 of state machine 514 latches the bit having a value of 1 and outputs the bit at address input 534.

Further, during a write cycle of state N, combinational logic circuit 532 of state machine 516 receives, via feedback loop 530, the bit having a value of 1 from state machine 514 to supply an additional bit having a value of 0 to register 526 of state machine 516. Register 526 of state machine 516 latches the additional bit in state N and outputs the additional bit to address driver 604.

Moreover, during a write cycle of state N, write control line 636 is enabled and address driver 604 decodes bit address 10 generated by combining the bit having a value of 1 from state machine 514 and the additional bit having a value of 0 of state N to enable write enable line 626 corresponding to the bit address 10. During a write cycle of state N, data input 536 into one of bit-line registers 602 is written, via write data line 630, to memory cell 620 having the bit address 10.

Further, during state N, a read cycle is executed. A read cycle of state N may occur during a time period of clock signal 522. For example, a read cycle of state N occurs during half of a time period of clock signal 522 and a write cycle of state N occurs during the remaining half of the time period. As another example, a read cycle of state N occurs during one-third of a time period of clock signal 522 and a write cycle of state N occurs during the remaining two-thirds of the time period. During a read cycle of state N, combinational logic circuit 528 of state machine 514 supplies a bit having a value of 0 to register 526 of state machine 514. During a read cycle of state N, register 526 of state machine 516 receives the bit having a value of 0 from combinational logic circuit 528 and outputs the bit at address input 534.

Further, during a read cycle of state N, combinational logic circuit 532 of state machine 516 receives, via feedback loop 530, a bit having a value of 0 to supply a bit having a value of 0 to register 526 of state machine 516. During a read cycle of state N, register 526 of state machine 516 latches the bit having a value of 0 in state N and outputs the bit to address driver 604.

Moreover, during a read cycle of state N, read control line 634 is enabled and address driver 604 decodes bit address 00 generated by combining the bit having a value of 0 and the bit having a value of 0 of state N to enable read enable line 628 corresponding to the bit address 00.

Further, during a read cycle of state N, data stored within memory cell 608 having the bit address 00 is read, via data read line 632 connected to the memory cell, by read circuit 606. Read circuit 606 latches data read from memory cell 608 having bit address 00 in state N and supplies the data to one of bit-line registers 602. Data provided from memory cell 608 having bit address 00 in state N to bit-line registers 602 is shifted out at data output 538 and transferred to destination register 520.

In another embodiment, system 600 includes a higher or a lower number of memory cells than that shows in FIG. 6, a higher or lower number of read circuits than that shown in FIG. 5, a higher or a lower number of data read lines than that shown in FIG. 6, a higher or a lower number of write data lines than that shown in FIG. 6, a higher or a lower number of read enable lines than that shown in FIG. 6, and/or a higher or a lower number of write enable lines than that shown in FIG. 6. In any embodiment, for every memory cell 608, 610, 612, 614, 616, 618, 620, 622, and 624, system 600 includes a data read line, a write data line, a write enable line, and a read enable line.

Figure 8:
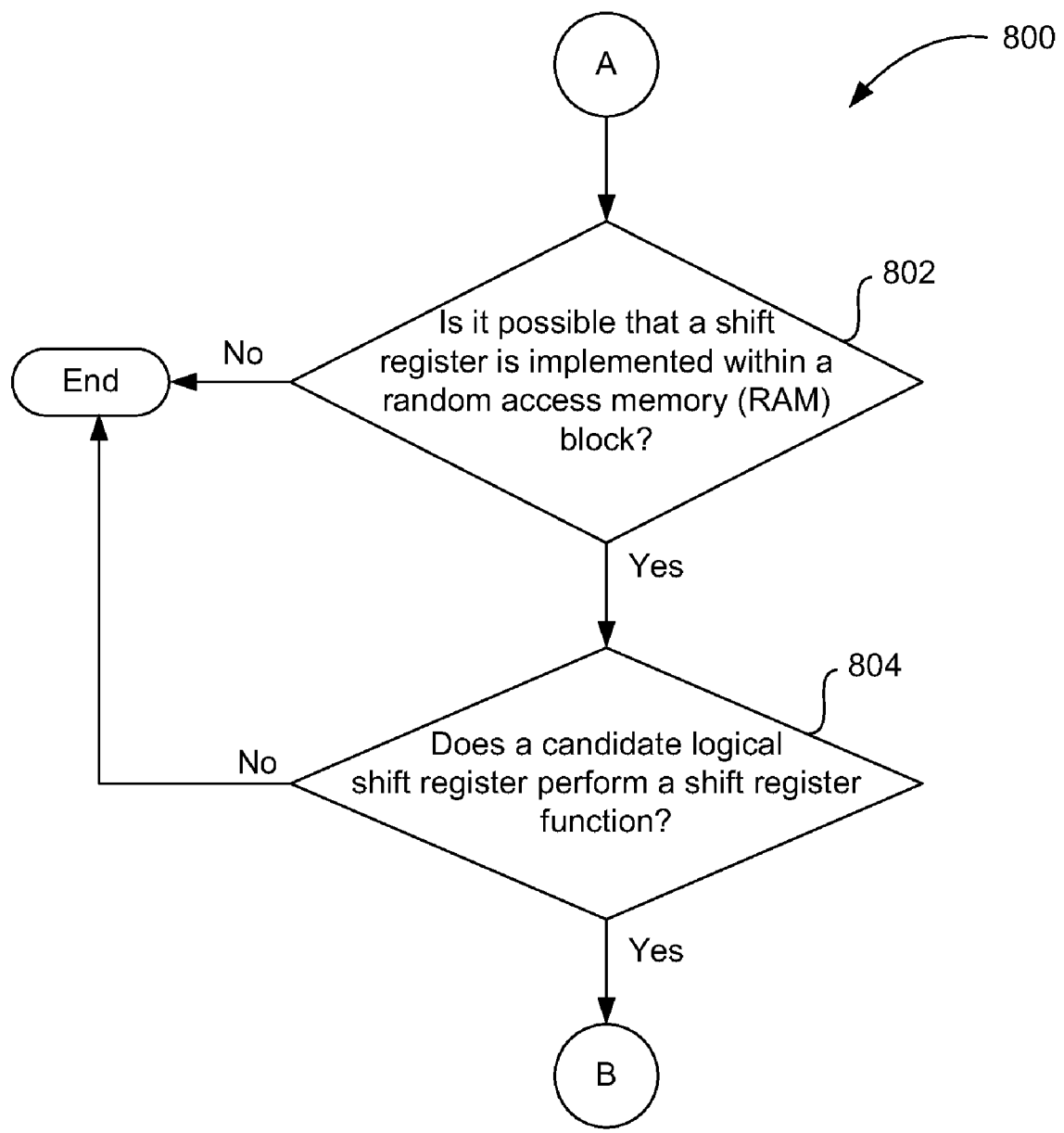
FIG. 8 is a flowchart of an embodiment of a method for improving a maximum operating frequency of an integrated circuit.
Figure 9:
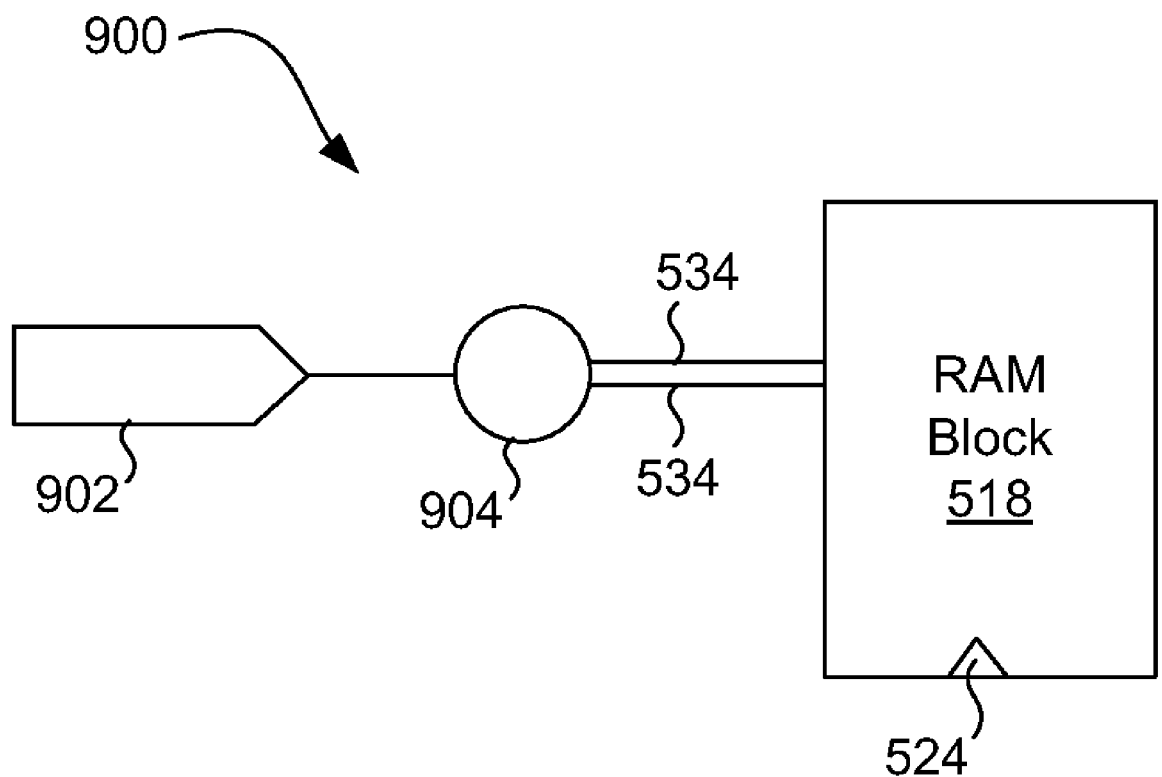
FIG. 9 is a block diagram of an embodiment of a system illustrating the method of FIG. 8.
Figure 10:
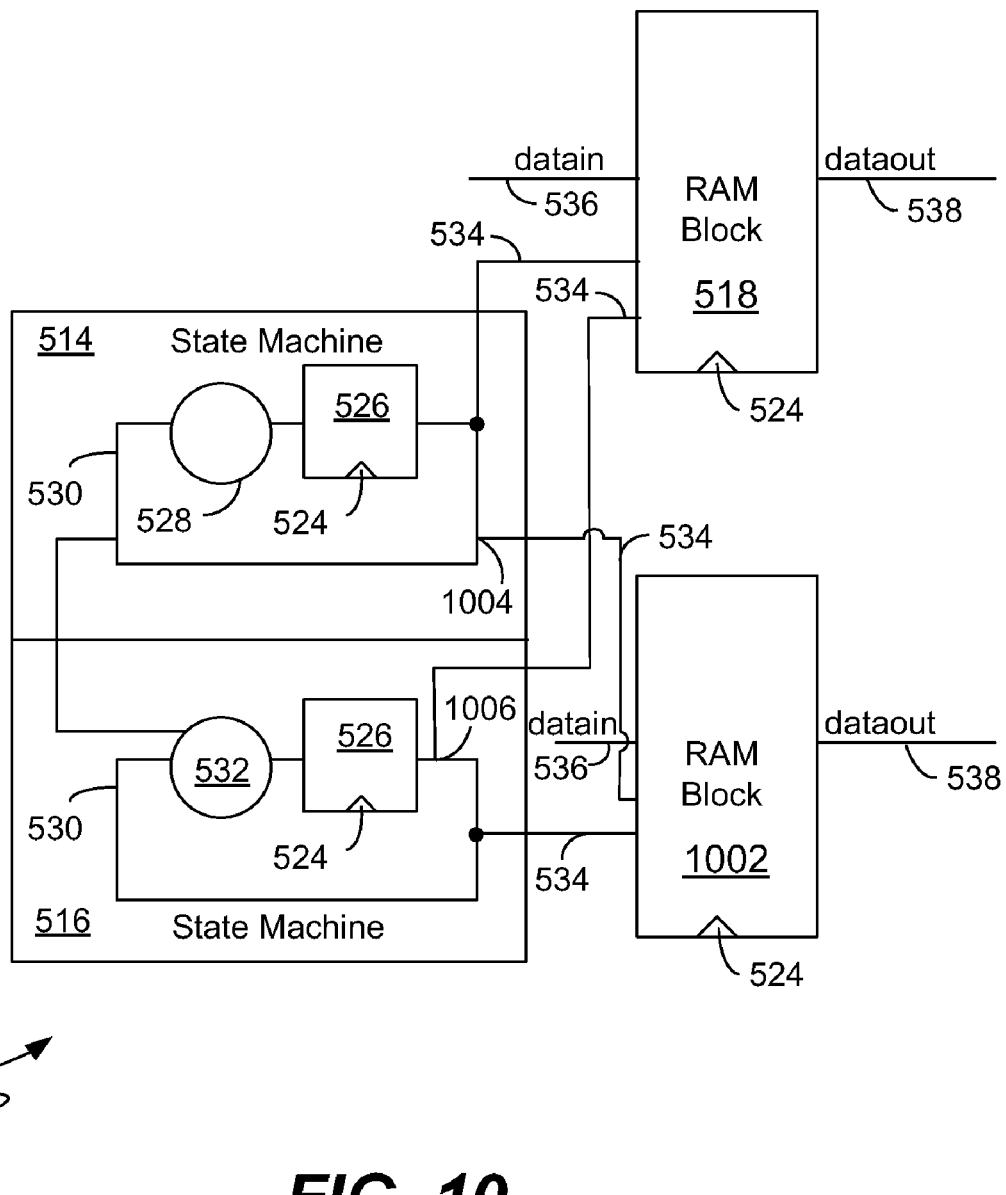
FIG. 10 is a block diagram of an embodiment of a system illustrating the method of FIG. 8.

FIG. 8 is a flowchart of an embodiment of a method 800 for improving a maximum operating frequency of an integrated circuit, FIG. 9 is a block diagram of an embodiment of a system 900 illustrating the method of FIG. 8, and FIG. 10 is a block diagram of an embodiment of a system 1000 illustrating the method of FIG. 8.

Processing unit 120 determines 802 whether it is possible to include, such as implement, a shift register within RAM block 518 (FIG. 6). For example, processing unit 120 determines whether there is any probability that a shift register is implemented within RAM block 518. To determine whether it is possible that a shift register is included within RAM block 518, processing unit 120 determines whether address inputs 534 of RAM block 518 are driven by a primary input 902, shown in FIG. 9. Address inputs 534 of RAM block 518 are driven by primary input 902 if the address inputs 534 receives a set of bits from primary input 902. Referring to FIG. 9, primary input 902, a combinational logic circuit 904, and RAM block 518 are included within system 900.

Combinational logic circuit 904 may be a gate, such as an AND gate or an OR gate, or a combination of the gates. Primary input 902 is a bit source that provides a bit, which has a particular value of 0 or 1, to address inputs 534 of RAM block 518. Combinational logic 904 further transfers the bit from primary input 902 to address inputs 534.

Referring back to FIG. 8, upon determining that address inputs 534 are driven by primary input 902, processing unit 120 determines that it is not possible that a shift register is included within RAM block 518 and ends method 800. For example, upon determining that address inputs 534 are driven by primary input 902, processing unit 120 determines that there is zero probability that a shift register is included within RAM block 518 and ends method 800.

Upon determining that address inputs 534 are not driven by primary input 902, processing unit 120 marks, such as flags or designates, RAM block 518 to be in a first set and also marks address inputs 534 to be in the first set, and determines that it is possible that RAM block 518 includes a shift register. For example, upon determining that address inputs 534 are not driven by primary input 902, processing unit 120 determines that address inputs 534 are driven by state machines 514 and 516. Processing unit 120 finds a shift register within a RAM block upon determining that it is possible that the shift register is included within the RAM block.

Processing unit 120 repeats 802 for all RAM blocks of PLD 200 except for MegaRAM block 204. For example, processing unit 120 determines 802 whether a RAM block 1002, shown in FIG. 10, can possibly include a shift register. Referring to FIG. 10, RAM block 518, RAM block 1002, and state machines 514 and 516 are included within system 1000. RAM block 1002 has data input 536 and data output 538, and further has address inputs 534. RAM block 1002 also has clock input 524 that receives clock signal 522 from clock source 502. RAM block 1002 may be included within PLD 200.

Upon determining that it is not possible for RAM block 1002 to include a shift register, processing unit 120 returns to method 800 of FIG. 8 and determines 804 whether a shift register found in RAM block 518 performs a shift register function. Further, upon determining that it is possible that RAM block 1002 includes a shift register, processing unit 120 marks the RAM block to be within a second set. Upon marking RAM block 1002 to be within the second set, processing unit 120 determines whether address inputs 534 of RAM blocks 518 and 1002 have a set of common nodes 1004 and 1006. Upon determining that address inputs 534 do not have common nodes 1004 and 1006, processing unit 120 determines 804 whether a shift register found in RAM block 518 performs a shift register function. On the other hand, upon determining that address inputs 534 have common nodes 1004 and 1006, processing unit 120 marks common nodes 1004 and 1006 to be within the second set, and converts the first and second sets into a common set. In this common set, the shift registers of the two RAM blocks 518 and 1002 and the common nodes 1004 and 1006 form a potential logical shift register.

Referring to FIG. 8, upon generating the common set or upon generating the first set, processing unit 120 determines 804 whether a candidate logical shift register performs a shift register function. The candidate logical shift register may be the potential logical shift register or a shift register of RAM block 518 (FIG. 6).

Processing unit 120 performs the determination in 804 to verify whether the candidate logical shift register performs a shift register function. Processing unit 120 ends method 800 upon verifying that the candidate logical shift register does not perform a shift register function.

In an embodiment in which a shift register is found in RAM block 518 and the common set is not formed, processing unit 120 determines 804 whether a shift register found in RAM block 518 performs a shift register function by writing a first bit, such as 0 or 1, to memory cell 608 (shown in FIG. 6) having bit address 00 during a write cycle of state 0 and by reading, during a read cycle of state 0, a second bit from memory cell 614 having bit address 01 that is consecutive to bit address 00. Processing unit 120 writes the first bit to bit address 00 during a write cycle of state 0 by controlling state machines 514 and 516 to output bit address 00, enabling write control signal 636, and by transferring the first bit from bit-line registers 602 to memory cell 608 having bit address 00. Further, processing unit 120 reads the second bit during a read cycle of state 0 from bit address 01 by controlling state machines 514 and 516 to output bit address 01, enabling read control line 634, and by reading, via read circuit 606 and data read line 632, the second bit from memory cell 614 having bit address 01.

Further, in this embodiment, processing unit 120 determines 804 whether a shift register found in RAM block 518 performs a shift register function by writing a third bit, such as 0 or 1, to memory cell 614 having bit address 01 during a write cycle of state 1 and by reading, during a read cycle of state 1, a fourth bit from memory cell 620 having bit address 10 that is consecutive to bit address 01. Processing unit 120 writes the third bit to bit address 01 during a write cycle of state 1 by controlling state machines 514 and 516 to output bit address 01, enabling write control signal 636, and by transferring the third bit from bit-line registers 602 to memory cell 614 having bit address 01. Processing unit 120 reads the fourth bit during a read cycle of state 1 from bit address 10 by controlling state machines 514 and 516 to output bit address 10, enabling read control line 634, and by reading, via read circuit 606 and data read line 632, the fourth bit from memory cell 620 having bit address 10.

Moreover, in this embodiment, processing unit 120 determines 804 whether a shift register found in RAM block 518 performs a shift register function by writing a fifth bit, such as 0 or 1, to memory cell 620 having bit address 10 during a write cycle of state N and by reading, during a read cycle of state N, a sixth bit from memory cell 608 having bit address 00 that is consecutive to bit address 10. Processing unit 120 writes the fifth bit to bit address 10 during a write cycle of state N by controlling state machines 514 and 516 to output bit address 10, enabling write control signal 636, and by transferring the fifth bit from bit-line registers 602 to memory cell 620 having bit address 10. Processing unit 120 reads the sixth bit during a read cycle of state N from bit address 00 by controlling state machines 514 and 516 to output bit address 00, enabling read control line 634, and by reading, via read circuit 606 and data read line 632, the sixth bit from memory cell 608 having bit address 00.

Further, in this embodiment, processing unit 120 determines 804 whether a shift register found in RAM block 518 performs a shift register function by writing a seventh bit, such as 0 or 1, to memory cell 608 having bit address 00 during a write cycle of state 0 and by reading, during a read cycle of state 0, an eighth bit from memory cell 614 having bit address 01 that is consecutive to bit address 00. Processing unit 120 writes the seventh bit to bit address 00 during a write cycle of state 0 by controlling state machines 514 and 516 to output bit address 00, enabling write control signal 636, and by transferring the seventh bit from bit-line registers 602 to memory cell 608 having bit address 00. Processing unit 120 reads the eighth bit during a read cycle of state 0 from bit address 01 by controlling state machines 514 and 516 to output bit address 01, enabling read control line 634, and by reading, via read circuit 606 and data read line 632, the eighth bit from memory cell 614 having bit address 01.

Further, in this embodiment, processing unit 120 determines 804 whether a shift register found in RAM block 518 performs a shift register function by writing a ninth bit, such as 0 or 1, to memory cell 614 having bit address 01 during a write cycle of state 1 and by reading, during a read cycle of state 1, a tenth bit from memory cell 6620 having bit address 10 that is consecutive to bit address 01. Processing unit 120 writes the ninth bit to bit address 01 during a write cycle of state 1 by controlling state machines 514 and 516 to output bit address 01, enabling write control signal 636, and by transferring the ninth bit from bit-line registers 602 to memory cell 614 having bit address 01. Processing unit 120 reads the tenth bit during a read cycle of state 1 from bit address 10 by controlling state machines 514 and 516 to output bit address 10, enabling read control line 634, and by reading, via read circuit 606 and data read line 632, the tenth bit from memory cell 620 having bit address 10.

Processing unit 120 determines whether the first bit is equal to the sixth bit, the third bit is equal to the eighth bit, and the fifth bit is equal to the tenth bit. Upon determining that the first bit is equal to the sixth bit, the third bit is equal to the eighth bit, and the fifth bit is equal to the tenth bit, processing unit 120 determines that a shift register found within RAM block 518 performs a shift register function. On the other hand, upon determining that the first bit is not equal to the sixth bit, the third bit is not equal to the eighth bit, or the fifth bit is not equal to the tenth bit, processing unit 120 determines that a shift register found within RAM block 518 does not perform a shift register function and is not a shift register.

State 0 may occur during a first clock cycle of clock signal 522, state 1 may occur during a second clock cycle of clock signal 522, and state N may occur during an Nth clock cycle of clock signal 522. The second clock cycle is consecutive to the first clock cycle and the $N^{th}$ clock cycle is consecutive to the second clock cycle.

In another embodiment in which the common set is generated, processing unit 120 performs the determination 804 for RAM block 518 and RAM block 1002 to determine whether the candidate logical shift register performs a shift register function.

For example, upon determining that RAM block 518 and/or RAM block 1002 does not perform a shift register function, processing unit 120 ends method 800. As another example, upon determining that each of RAM block 518 and RAM block 1002 performs a shift register function, processing unit 120 determines that the candidate logical shift register performs a shift register function and that the candidate logical shift register is a logical shift register.

In yet another embodiment, state 0 may occur during a first plurality of clock cycles of clock signal 522, state 1 may occur during a second plurality of clock cycles of clock signal 522, and state N may occur during an $N^{th}$ plurality of clock cycles of clock signal 522. In still another embodiment, processing unit 120 does not perform process 804. In various embodiments, processing unit 120 performs process 804 by executing a software. For example, processing unit 120 executes a computer aided design (CAD) software without actually writing to a RAM on a physical circuit board to simulate the actual write onto the candidate logical shift register.

In another embodiment, processing unit 120 repeats 802 for all RAM blocks of PLD 200. In yet another embodiment, one of clock inputs 524 of PLD 200 receives clock signal 522 from clock source 502 and the remaining clock inputs 524 of PLD 200 receives a clock signal 522, from another clock source (not shown), that is synchronized to clock signal 522. For example, RAM block 518 receives clock signal 522 and RAM block 1002 receives another clock signal, from another clock source (not shown), which is synchronized with clock signal 522.

It is noted that in various embodiments, if the execution of states 0 through N is not performed for a first time by processing unit 120, processing unit 120 executes states 0 through N once without repeating the execution of the states 0 through N to determine whether the candidate logical shift register performs a shift register function.

For example, after processing unit 120 executes states 0 through N for a second time consecutive to the first time to determine 804 whether the candidate logical shift register performs a shift register function, processing unit 120 terminates 804 upon determining that states 0 through N will be repeated for a third time consecutive to the second time.

Figure 11:
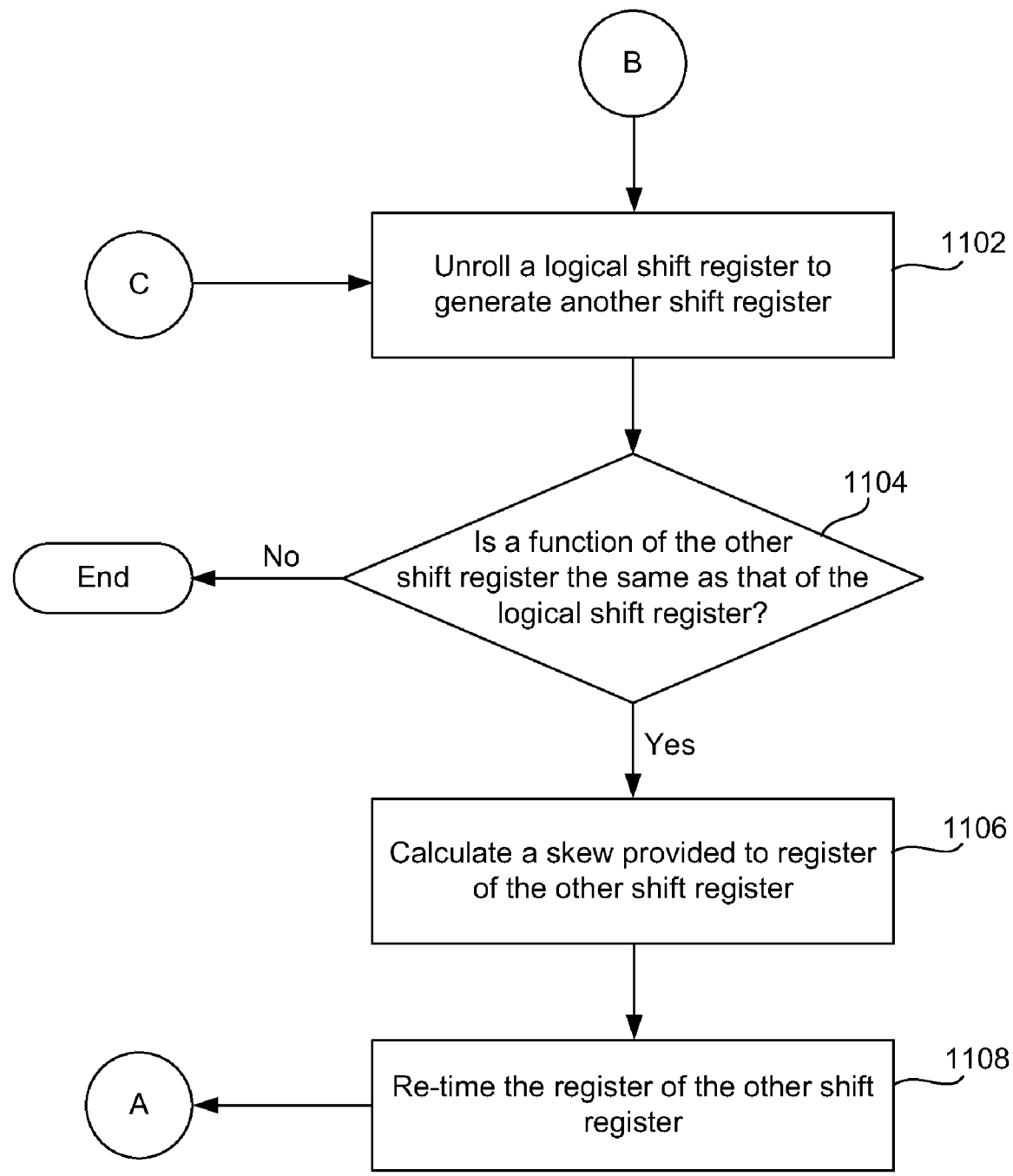
FIG. 11 is a continuation of the flowchart of FIG. 8.
Figure 12:
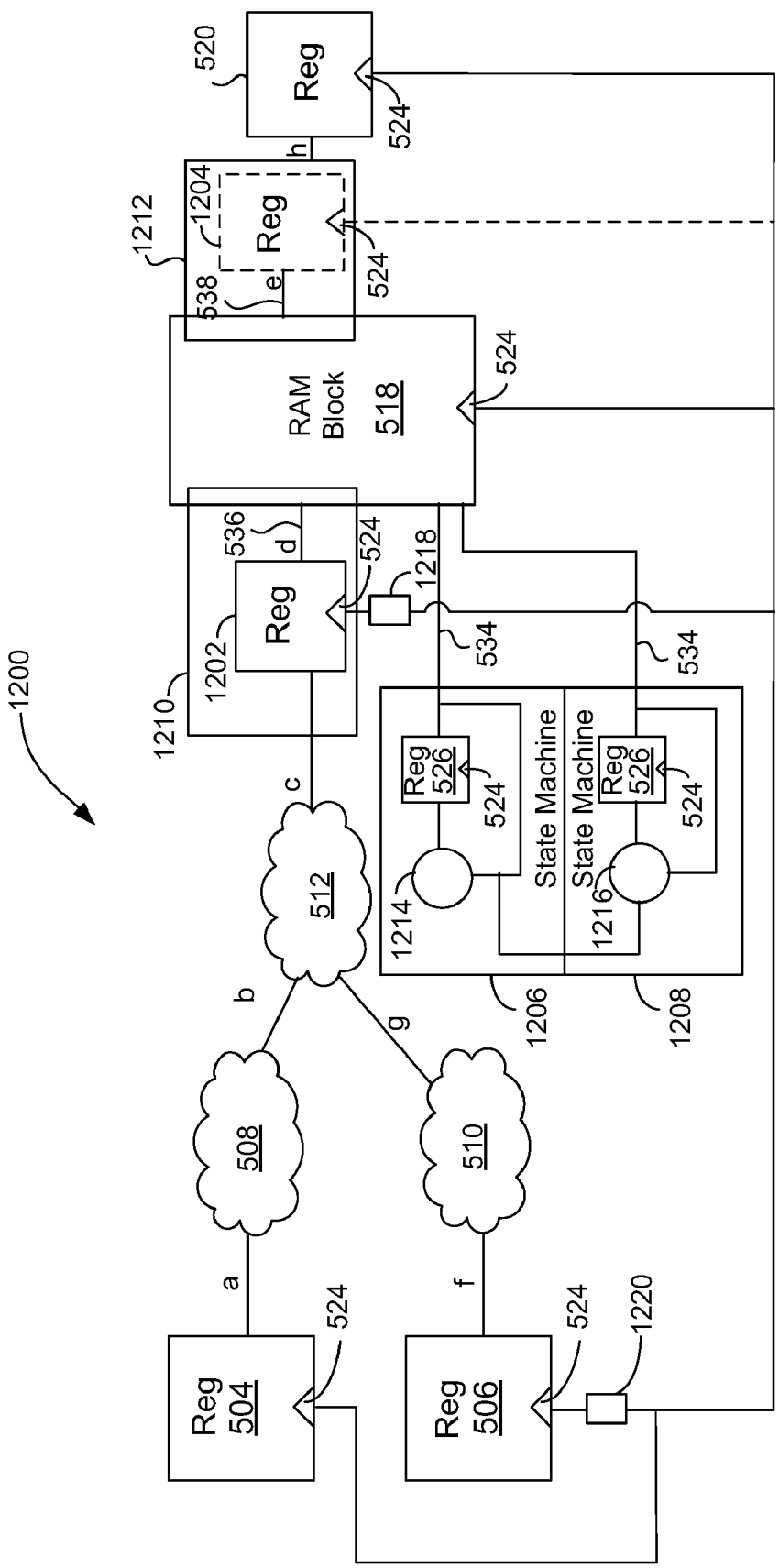
FIG. 12 is a diagram of an embodiment of a portion of the PLD of FIG. 2.
Figure 13:
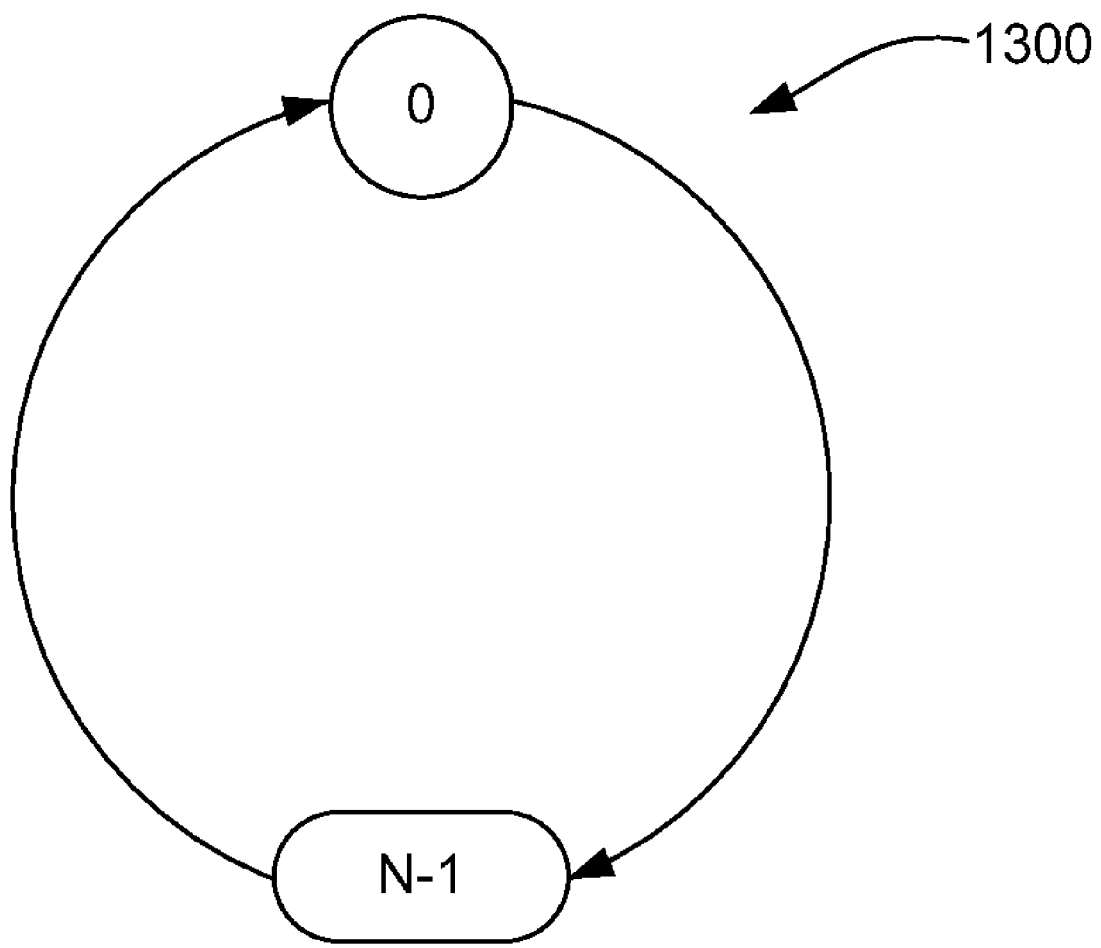
FIG. 13 is an exemplary state diagram illustrating the method of FIG. 11.
Figure 14:
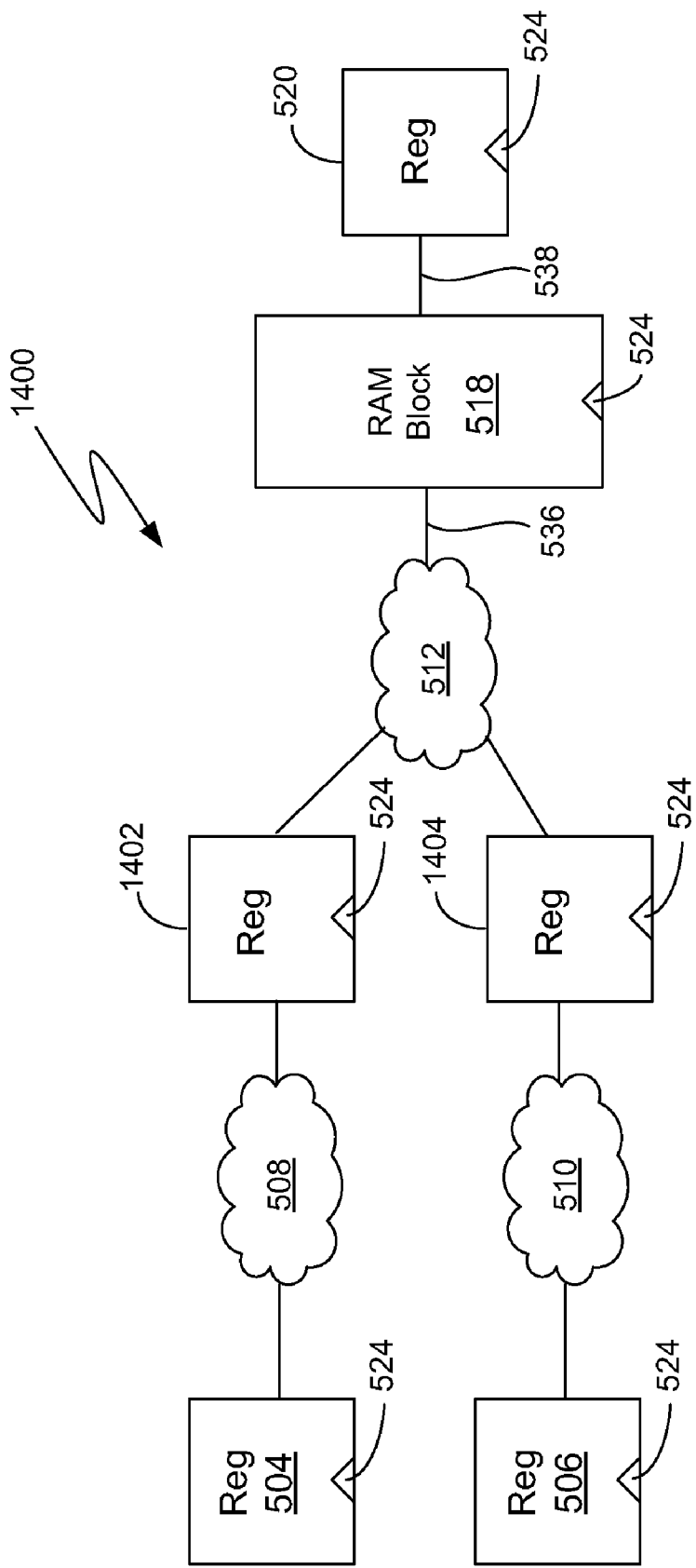
FIG. 14 is a block diagram of an embodiment of a portion of the PLD used to illustrate the method of FIG. 11.

FIG. 11 is a continuation of the flowchart of FIG. 8, FIG. 12 is a diagram of an embodiment of a portion 1200 of PLD 200, FIG. 13 is an exemplary state diagram 1300 illustrating the method for improving a maximum operating frequency of an integrated circuit, and FIG. 14 is a block diagram of an embodiment of a portion 1400 of PLD 200 after applying retiming. Upon determining 804 that a shift register function is implemented within the candidate logical shift register, processing unit 120 unrolls 1102 the logical shift register to generate another shift register.

Processing unit 120 unrolls 1102 the logical shift register by removing a register from the logical shift register and adding a register at data input 536 and/or at data output 538 of a set including at least one of RAM blocks 518 and 1002. For example, if memory cell 608 that has bit address 00 and that is used to implement a leftmost register of a shift register of RAM block 518 is freed, such as undesignated, from performing a function of the register of the shift register, processing unit 120 unrolls the logical shift register by adding an input register 1202, shown in FIG. 12, to data input 536 of the RAM block 518. In this example, processing unit 120 preserves the functionality of the logical shift register by adding input register 1202. As another example, if memory cell 610 that has bit address 11 and that is used to implement a rightmost register of a shift register of RAM block 518 is freed, such as undesignated, from performing a function of the register of the shift register, processing unit 120 unrolls the logical shift register by adding an output register 1204, shown in FIG. 12, to data output 538 of the RAM block 518. In this example, processing unit 120 preserves the functionality of the logical shift register by adding output register 1204.

An example of adding input register 1202 at data input 536 or adding output register 1204 at data output 538 is shown in FIG. 12. Referring to FIG. 12, portion 1200 includes source registers 504 and 506, destination register 520, nodes 508, 510, and 512, a plurality of state machines 1206 and 1208, and input register 1202. In another embodiment, portion 1200 includes output register 1204 indicated in dotted lines. State machine 1206 includes a combination logic 1214 and register 526, and state machine 1208 includes a combinational logic 1216 and register 526. Combinational logic 1214 includes a gate, such as an AND gate, an OR gate, a NAND gate, and a NOR gate, or a combination of the gates. Moreover, combinational logic 1216 includes a gate, such as an AND gate, an OR gate, a NAND gate, and a NOR gate, or a combination of the gates.

Processing unit 120 unrolls a shift register of RAM block 518 by reducing a number of states of state machines 514 and 516 by an amount of number of registers added at data input 536 and/or at data output 538. For example, if a single input register 1202 is added at data input 536, processing unit 120 reduces the number of states from N to N−1. In this embodiment in which processing unit 120 unrolls a shift register of RAM block 518 by adding at least one input register 1202 and/or at least one output register 1204, processing unit 120 reduces the number of states of state machines 514 and 516 by the number of input registers 1202 and/or output registers 1204 added. For example, if two input registers 1202 are added in series to data input 536, processing unit 120 reduces the number of states from N to N−2. As another example, if two output registers 1204 are added in series to data output 538, processing unit 120 reduces the number of states from N to N−2. As another example, if one input register 1202 is added to data input 536 and one output register 1204 is added to data output 538, processing unit 120 reduces the number of states from N to N−2. An example of reduced number of states from N to N−1 is illustrated in FIG. 13.

Processing unit 120 reduces the number of states of state machines 514 and 516 to resynthesize the state machines 514 and 516 and to generate state machines 1206 and 1208. Each state machine 1206 and 1208 have the same structure as that any of state machines 514 and 516 except that state machines 1206 and 1208 have N−1 states if input register 1202 or output register 1204 is added. Processing unit 120 unrolls the logical shift register to generate an input shift register 1210 or an output shift register 1212. For example, if processing unit 120 unrolls a shift register of RAM block 518 by adding input register 1202, processing unit 120 unrolls the shift register to generate input shift register 1210. As another example, if processing unit 120 unrolls a shift register of RAM block 518 by adding output register 1204, processing unit 120 unrolls the shift register to generate output shift register 1212.

Upon unrolling the logical shift register, processing unit 120 determines 1104 whether a function of input shift register 1210 or output shift register 1212 is the same as that of the logical shift register. Processing unit 120 performs 1104 to ensure that the functionality of input shift register 1210 or output shift register 1212 is the same as that of the logical shift register. Processing unit 120 determines 1104 by operating input shift register 1210 or output shift register 1212. For example, during process X, processing unit 120 sends an eleventh bit to input register 1202 that latches the eleventh bit and enables read control line 634 and controls state machines 1206 and 1208 and read circuit 606 to read a twelfth bit from memory cell 614 having bit address 01. Further, in this example, during state 0 of state machines 1206 and 1208, processing unit 120 enables write control line 636 and controls state machines 1206 and 1208 and bit-line registers 602 to write a thirteenth bit to memory cell 614 having bit address 01 and enables read control line 634 and controls address driver 604 and read circuit 606 to read a fourteenth bit from memory cell 620 having bit address 10. Moreover, in this example, during state N–1 of state machines 1206 and 1208, processing unit 120 enables write control line 636 and controls state machines 1206 and 1208 and bit-line registers 602 to write a fifteenth bit to memory cell 620 having bit address 10 and enables read control line 634 and controls address driver 604 and read circuit 606 to read a sixteenth bit from input register 1202. Additionally, in this example, during process X, processing unit 120 sends a seventeenth bit to input register 1202 that latches the seventeenth bit and enables read control line 634 and controls state machine and read circuit 606 to read an eighteenth bit from memory cell 614 having bit address 01. Further, in this example, during state 0 of state machines 1206 and 1208, processing unit 120 sends a nineteenth bit to memory cell 614 having bit address 01 and enables read control line 634 and controls state machine and read circuit 606 to read a twentieth bit from memory cell 620 having bit address 10.

In this example, processing unit 120 determines that a function of input shift register 1210 is the same as that of a shift register found and verified within the logical shift register upon determining that the eleventh bit is equal to the sixteenth bit, the thirteenth bit is equal to the eighteenth bit, and the fifteenth bit is equal to the twentieth bit. On the other hand, in this example, upon determining that the eleventh bit is not equal to the sixteenth bit, the thirteenth bit is not equal to the eighteenth bit, or the fifteenth bit is not equal to the twentieth bit, processing unit 120 determines that a function of a shift register found and verified within the logical shift register is not the same as input shift register 1210 and ends the method.

As another example, during state 0 of state machines 1206 and 1208, processing unit 120 enables write control line 636, and controls state machines 1206 and 1208 and bit-line registers 602 to write a twenty-first bit to memory cell 608 having bit address 00 and enables read control line 634 and read circuit 606 to read a twenty-second bit from memory cell 614 having bit address 01. In this example, during state N–1 of state machines 1206 and 1208, processing unit 120 enables write control line 636, and controls state machines 1206 and 1208 and bit-line registers 602 to write a twenty-third bit to memory cell 614 having bit address 01 and receives a twenty-fourth bit from output register 1204. In this example, during process Y, processing unit 120 sends a twenty-fifth bit to output register 1204 that latches the twenty-fifth bit and enables read control line 634 and read circuit 606 to read a twenty-sixth bit from memory cell 608 having bit address 00. In this example, during state 0 of state machines 1206 and 1208, processing unit 120 enables write control line 636, and controls state machines 1206 and 1208 and bit-line registers 602 to write a twenty-seventh bit to memory cell 608 having bit address 00 and enables read control line 634 and read circuit 606 to read a twenty-eighth bit from memory cell 614 having bit address 01. Moreover, in this example, during state N–1 of state machines 1206 and 1208, processing unit 120 enables write control line 636 and controls state machines 1206 and 1208 and bit-line registers 602 to write a twenty-ninth bit to memory cell 614 having bit address 01 and processing unit 120 receives a thirtieth bit from output register 1204.

In this example, processing unit 120 determines that a function of output shift register 1212 is the same as that of a shift register found and verified within the logical shift register upon determining that the twenty-first bit is equal to the twenty-sixth bit, the twenty-third bit is equal to the twenty-eighth bit, and the twenty-fifth bit is equal to the thirtieth bit. On the other hand, in this example, upon determining that the twenty-first bit is not equal to the twenty-sixth bit, the twenty-third bit is not equal to the twenty-eighth bit, or the twenty-fifth bit is not equal to the thirtieth bit, processing unit 120 determines that a function of a shift register found and verified within the logical shift register is not the same as output shift register 1212 and ends method 800.

Referring back to FIG. 11, processing unit 120 calculates 1106 a clock skew to apply to input register 1202 or to output register 1204 to improve a maximum operating frequency of an additional system. The additional system is the same as system 1200 except that the additional system does not include a clock skew 1218 and a clock skew 1220. For example, in an embodiment in which input register 1202 is added and output register 1204 is not added, referring to FIG. 12, processing unit 120 performs a timing analysis to determine a set A of data delays a, b, c, d, e, f, and g of all connections of the additional system and determines a maximum operating frequency $F_1$ of PLD 200 based on the set A, where a, b, c, d, k, f, and g are measured in seconds, a is a data delay of a connection between source register 504 and node 508, b is a data delay of a connection between nodes 508 and 512, c is a data delay of a connection between node 512 and input register 1202, d is a data delay of a connection between input register 1202 and RAM block 518, k is a data delay of a connection between destination register 520 and RAM block 518, f is a data delay of a connection between source register 506 and node 510, and g is a data delay of a connection between nodes 510 and 512. The maximum operating frequency $F_1$ is an inverse of a longest path delay, such as data delay b, of the additional system. Processing unit 120 further determines that by applying clock skew 1218 to input register 1202 and clock skew 1220 to source register 506, the maximum operating frequency of the additional system increases to $F_2$, which is a maximum operating frequency of system 1200. As another example, in an embodiment in which input register 1202 is not added and output register 1204 is added, processing unit 120 performs a timing analysis to determine a set B of delays, a, b, e, f, g, h, and l of all connections of the additional system and determines the maximum operating frequency $F_1$ of PLD 200 based on the set B, where e is a data delay of a connection between RAM block 518 and output register 1204, h is a data delay of a connection between output register 1204 and destination register 520, l is a data delay of a connection between node 512 and RAM block 518, and e, l, and h are measured in seconds. In this example, processing unit 120 further determines that by applying a clock skew to output register 1204 and clock skew 1220 to source register 506, the maximum operating frequency of the additional system increases to $F_2$.

Referring back to FIG. 11, processing unit 120 retimes 1108 a register, such as input register 1202 or output register 1204, to achieve the maximum operating frequency $F_2$. For example, processing unit 120 retimes input register 1202 by shifting a location of input register 1202 and shifts the location by removing input register 1202 from between node 512 and RAM block 518 and placing a set of registers 1402 and 1404 as shown in FIG. 14. Register 1402 is placed between node 508 and node 512 and register 1404 is placed between node 510 and node 512. As another example, processing unit 120 retimes input register 1202 by shifting a location of input register 1202 and shifts the location by removing input register 1202 from between node 512 and RAM block 518 and placing a register (not shown) between RAM block 518 and destination register 520. As yet another example, processing unit 120 retimes output register 1204 by shifting a location of output register 1204 and shifts the location by removing output register 1204 from between RAM block 518 and destination register 520 and placing registers 1402 and 1404 as shown in FIG. 14. Improving the maximum operating frequency from $F_1$ to $F_2$ by using retiming is performed by processing unit 120 with a goal of eliminating clock skews, such as clock skews 1218 and 1220.

It is noted that in various embodiments, if the execution of process X and states 0 through N−1 has been repeated after performance of the process and the states for a first time by processing unit 120, the processing unit executes the process and the states once without repeating the execution of the process and the states to determine 1104 whether a function of input shift register 1210 is the same as that of the logical shift register. For example, after processing unit 120 executes process X and states 0 through N−1 for a second time consecutive to the first time to determine 1104 whether a function of input shift register 1210 is the same as that of the logical shift register, processing unit 120 terminates 1104 upon determining that states 0 through N−1 will be repeated for a third time consecutive to the second time.

It is further noted that in various embodiments, if the execution of states 0 through N−1 and process Y has been repeated after performance of the process and the states for a first time by processing unit 120, the processing unit executes the states and the process once without repeating the execution of the states and the process to determine whether a function of output shift register 1212 is the same as that of the logical shift register. For example, after processing unit 120 executes states 0 through N−1 and process Y for a second time consecutive to the first time to determine whether a function of output shift register 1212 is the same as that of the logical shift register, processing unit 120 discontinues determining whether the function of the output shift register is the same as that of the logical shift register upon determining that the states and the process will be repeated for a third time consecutive to the second time.

In yet another embodiment, system 1200 includes both input register 1202 and output register 1204. In another embodiment, processing unit 120 unrolls the logical shift register to generate input shift register 1210 and output shift register 1212. In another embodiment, upon unrolling the logical shift register, processing unit 120 determines whether a function of input shift register 1210 and output shift register 1212 is the same as that of the logical shift register. In yet another embodiment, processing unit 120 determines any number of clock skews to be applied to any number of registers of system 1200 to achieve the maximum operating frequency $F_2$. In another embodiment, 1104 is not performed.

Figure 15:
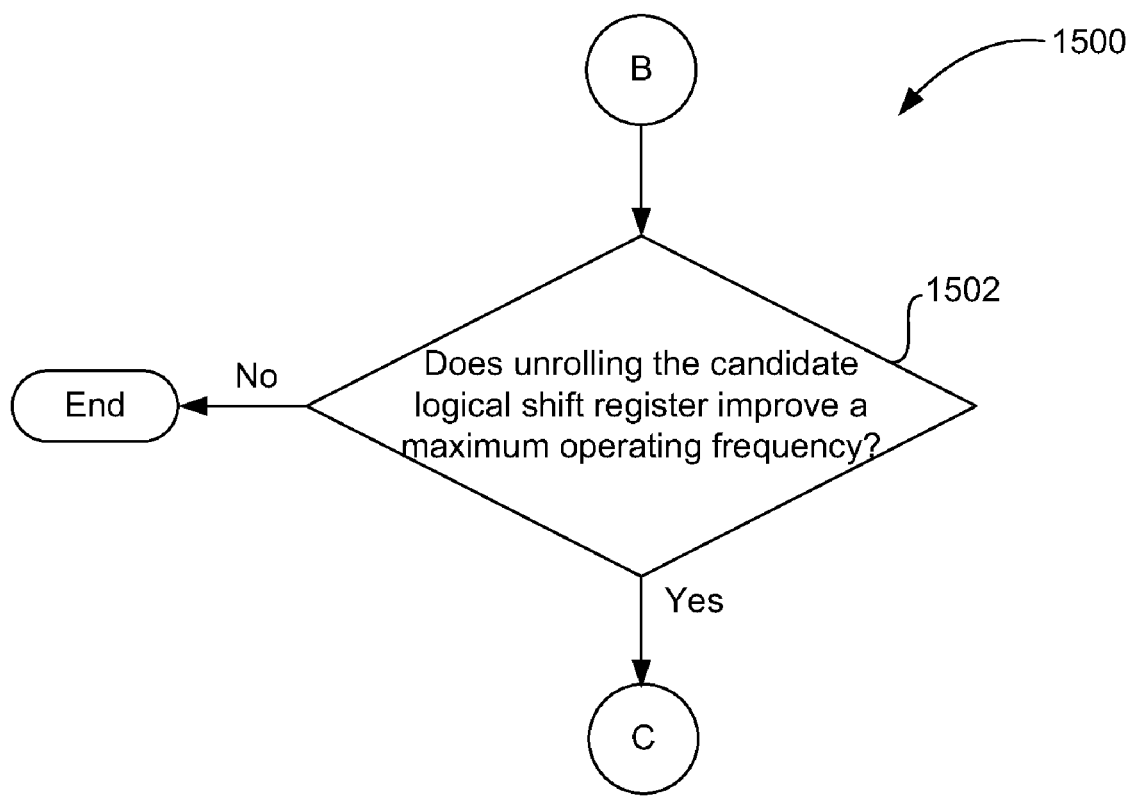
FIG. 15 is a flowchart of another embodiment of a method for improving a maximum operating frequency of an integrated circuit.
Figure 16:
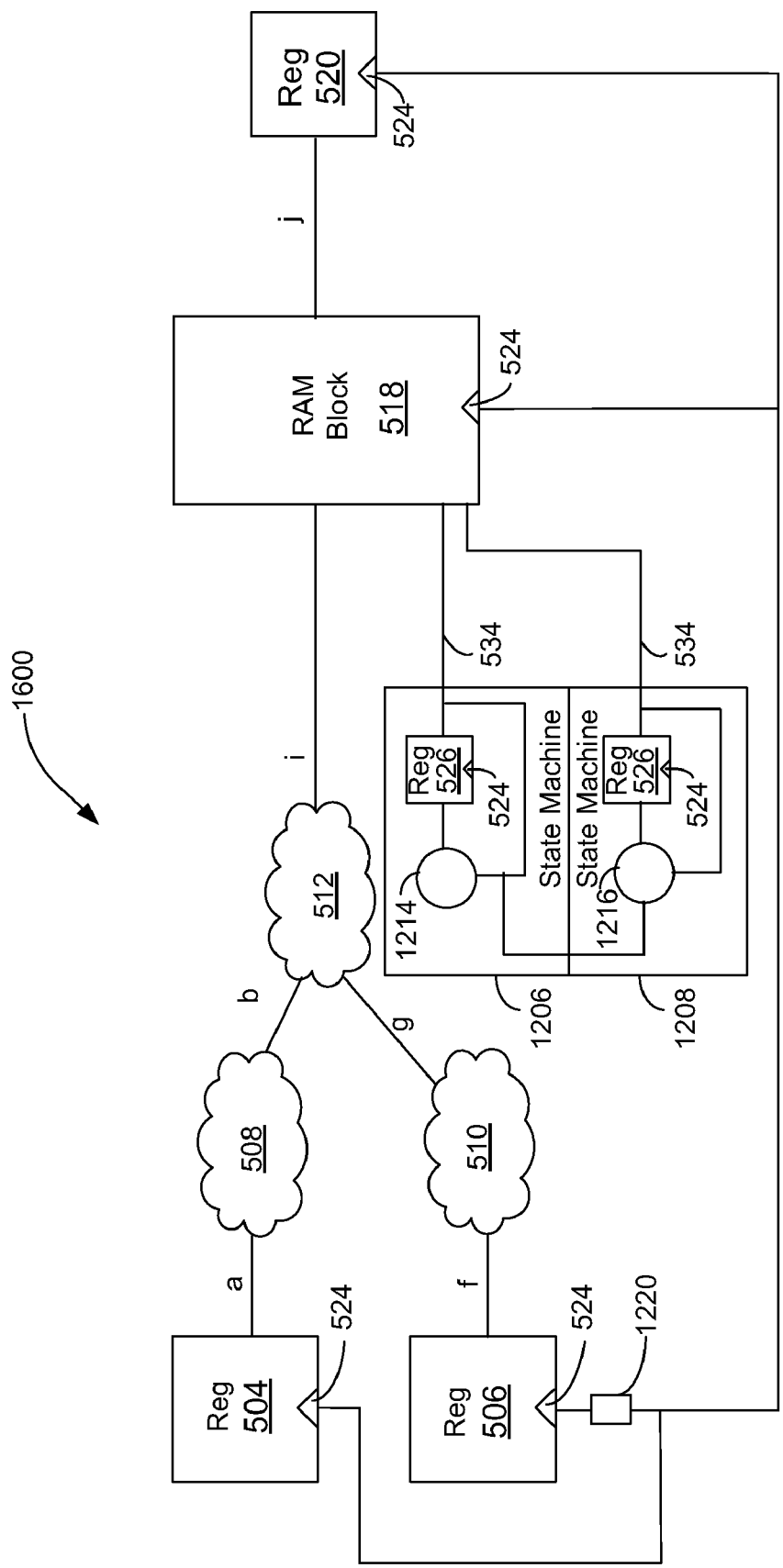
FIG. 16 is a block diagram of an embodiment of a system used to illustrate the method of FIG. 15.

FIG. 15 is a flowchart of another embodiment of a method 1500 for improving a maximum operating frequency of an integrated circuit and FIG. 16 is a block diagram of an embodiment of a system 1600 for improving maximum operating frequency. System 1600 is another example of PLD 200. Method 1500 is similar to method 800 except that method performs a process 1502 between performing 804 and 1102. Upon determining 804 that a shift register function is implemented within the candidate logical shift register, processing unit 120 determines 1502 whether unrolling the logical shift register improves a maximum operating frequency of PLD 200. For example, processing unit 120 performs a timing analysis to determine a set C of data delays a, b, f, g, i, and j of all connections of system 1600 and determines a maximum operating frequency $F_3$ of system 1600 based on the set C, where i and j are measured in seconds, i is a data delay of the connection between node 512 and RAM block 518 and j is a data delay of a connection between RAM block 518 and destination register 520. The maximum operating frequency F3 is an inverse of a longest path delay, such as the data delay i or the data delay j, of system 1600.

Processing unit 120 determines whether the maximum operating frequency $F_3$ increases from $F_3$ to $F_4$ if the logical shift register is unrolled. For example, processing unit 120 determines whether the maximum operating frequency $F_3$ increases to $F_4$ upon unrolling the logical shift register to generate input register 1202. The maximum operating frequency $F_3$ increases to $F_4$ by reducing a length of the connection between node 512 and RAM block 518. As another example, processing unit 120 determines whether the maximum operating frequency $F_3$ increases to $F_5$ upon unrolling the logical shift register to generate output register 1204. The maximum operating frequency $F_3$ increases to $F_5$ by reducing a length of the connection between RAM block 518 and destination register 520.

Processing unit 120 unrolls 1102 the logical shift register to generate input register 1202 upon determining that the maximum operating frequency $F_3$ increases to F4 if the logical shift register is unrolled. On the other hand, upon determining that the maximum operating frequency $F_3$ does not increase if the logical shift register is unrolled, processing unit 120 ends method 1600.

Similarly, processing unit 120 unrolls 1102 the logical shift register to generate output register 1204 upon determining that the maximum operating frequency $F_3$ increases to $F_5$ if the logical shift register is unrolled. Upon determining that the maximum operating frequency $F_3$ does not increase if the logical shift register is unrolled, processing unit ends method 1600.

In another embodiment, to determine whether unrolling the logical shift register improves a maximum operating frequency of PLD 200, processing unit 120 performs a timing analysis to determine the set A of data delays of all connections of the additional system and determines the maximum operating frequency $F_1$ of PLD 200 based on the set A. In this embodiment, as an example, processing unit 120 further determines that if the logical shift register is unrolled to generate input register 1202 and clock skew 1218 is applied to input register 1202, the maximum operating frequency of the additional system increases to $F_2$. Further, as another example, in an embodiment in which input register 1202 is not added and output register 1204 is added, processing unit 120 performs a timing analysis to determine the set B of delays and determines the maximum operating frequency $F_1$ of PLD 200 based on the set B. In this example, processing unit 120 further determines that if a clock skew is applied to output register 1204, the maximum operating frequency of the additional system increases to $F_2$. Upon determining that the maximum operating frequency $F_1$ increases to $F_2$ by applying clock skew 1218 or the clock skew to output register 524, processing unit 120 determines to unroll the logical shift register. On the other hand, upon determining that the maximum operating frequency $F_1$ does not increase by applying clock skew 1218, processing unit 120 determines not to unroll the logical shift register and ends method 800. Similarly, upon determining that the maximum operating frequency $F_1$ does not increase by applying a clock skew to output register, processing unit 120 determines not to unroll the logical shift register and ends method 800.

It is noted that the methods described herein with reference to FIGS. 8-16 are performed during any of extract phase 402, synthesis phase 404, technology mapping phase 406, cluster phase 408, place phase 410, router phase, delay annotator phase 414, timing analysis phase 416, assembler phase 418, the physical synthesis phase I, and the physical synthesis phase II. For example, processing unit 120 determines whether a connection and a set of circuit components described by HDL describes a shift register to find the shift register within RAM block 518. It is further noted that in another embodiment, some of the processes within the flowcharts of FIGS. 4, 8, 11, and 15 can be performed in a different order than that shown or simultaneously in parallel.

Technical effects of the herein described systems and methods include improving a maximum operating frequency by using a shift register of a RAM block. Other technical effects include reducing an amount of time of improving a maximum operating frequency by finding a shift register. Further, a shift register implemented within a RAM block takes much less space on a substrate than that taken by a shift register that is located outside a RAM block and that includes a plurality of registers, such as D flip-flops or T flip-flops.

Although the foregoing systems and methods have been described in detail by way of illustration and example for purposes of clarity and understanding, it will be recognized that the above described systems and methods may be embodied in numerous other specific variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. A method for improving a maximum operating frequency of an integrated circuit including a first shift register within a first random access memory (RAM) block, said method comprising improving the maximum operating frequency by finding the first shift register implemented within the first RAM block.

2. A method in accordance with claim 1, further comprising verifying that the first shift register has a shift register function upon finding the first shift register.

3. A method in accordance with claim 1, wherein said finding comprises:
determining whether the first RAM block has an address input driven by a primary input set to a particular value; and
determining that the first RAM block has a probability of including the first shift register upon determining that the first RAM block has the address input not driven by the primary input;
marking the first RAM block to be in a first set;
marking the address input to be in the first set.

4. A method in accordance with claim 3, further comprising determining that the first RAM block does not include the first shift register upon determining that the first RAM block has the address input driven by the primary input, wherein said determining that the first RAM block has an address input not driven by the primary input comprises determining that the first RAM block has an address input controlled by a state machine.

5. A method in accordance with claim 3, further comprising:
determining that a second RAM block includes a second shift register;
marking the second RAM block to be in a second set;
determining whether the address input includes a common node between the first RAM block and the second RAM block;
generating a common set from the first and second sets upon determining that the address input includes the common node, wherein the first and second shift registers form a logical shift register.

6. A method in accordance with claim 1, wherein the first shift register includes a plurality of memory cells, wherein the first RAM block includes a data input and a data output, said method further comprising:
unrolling the first shift register to generate a second shift register, wherein said unrolling comprises:
removing a first register from the first shift register and adding a second register to the data input or the data output;
resynthesizing a first state machine coupled to the first shift register to generate a second state machine coupled to the second shift register.

7. A method in accordance with claim 1, further comprising preserving functionality of the first shift register by:
removing a first register from the first shift register;
adding a second register to an input or an output of the first RAM block to generate a second shift register;
resynthesizing a first state machine coupled to the first shift register to generate a second state machine coupled to the second shift register, wherein the second state machine includes a number of states less than a number of states of the first state machine.

8. A method in accordance with claim 7, further comprising ensuring that a functionality of the first shift register is preserved by operating the second shift register, wherein said ensuring comprising determining that a functionality of the second shift register is the same as that of the first shift register.

9. A method in accordance with claim 7, further comprising:
retiming the second register by shifting a location of the second register;
maximizing a maximum operating frequency of the integrated circuit by said retiming.

10. A method in accordance with claim 7, further comprising:
calculating a skew provided to the second register based on a maximum operating frequency of the integrated circuit including the second register;
retiming the second register based on the skew;
achieving a maximum operating frequency by said retiming.

11. A method in accordance with claim 1, wherein the first RAM block includes a first memory location and a second memory location, the second memory location consecutive to the first memory location, said method further comprising:
  verifying that the first shift register has a shift register function upon finding the first shift register;
  coupling a state machine to the first RAM block;
  generating a state by using the state machine;
  writing a first bit to the first memory location during a write clock cycle of the state;
  reading a second bit from the second memory location during a read cycle of the state, wherein said verifying comprises:
    determining whether the first bit is the same as the second bit;
    determining that the first shift register does not perform the shift register function upon said determining that the first bit is not the same as the second bit;
    determining that the first shift register performs the shift register function upon said determining that the first bit is the same as the second bit.

12. A method in accordance with claim 1, wherein said finding comprises determining that a set of connections and a set of circuit components described by a Hardware Description Language (HDL) describes the first shift register.

13. A method in accordance with claim 1, further comprising determining whether unrolling the first shift register improves the maximum operating frequency.

14. A method in accordance with claim 13, further comprising unrolling the first shift register upon determining that unrolling the first shift register improves the maximum operating frequency.

15. A system comprising:
  a memory device;
  a processing unit coupled to said memory device, said processing unit configured to improve a maximum operating frequency of an integrated circuit including a first shift register within a first random access memory (RAM) block, said processing unit configured to improve the maximum operating frequency by finding the first shift register implemented within the first RAM block.

16. A system in accordance with claim 15, wherein said processing unit further configured to verify that the first shift register has a shift register function upon finding the first shift register.

17. A system in accordance with claim 15, wherein said processing unit configured to find the first shift register by:
  determining whether the first RAM block has an address input driven by a primary input set to a particular value;
  determining that the first RAM block has a probability of including the first shift register upon determining that the first RAM block has the address input not driven by the primary input;
  marking the first RAM block to be in a first set;
  marking the address input to be in the first set.

18. A system in accordance with claim 17, wherein said processing unit further configured to determine that the first RAM block does not include the first shift register upon determining that the first RAM block has the address input driven by the primary input, wherein said processing unit configured to determine that the first RAM block has an address input not driven by the primary input by determining that the first RAM block has an address input controlled by a state machine.

19. A system in accordance with claim 15, wherein said processing unit further configured to:
  determine that a second RAM block includes a second shift register;
  mark the second RAM block to be in a second set;
  determine whether the address input includes a common node between the first RAM block and the second RAM block;
  generate a common set from the first and second sets upon determining that the RAM input is the common node, wherein the first and second shift registers form a logical shift register.

20. A system comprising:
  an input device;
  a memory device coupled to said input device;
  a processing unit coupled to said memory device, said processing unit configured to improve a maximum operating frequency of an integrated circuit including a first shift register within a first random access memory (RAM) block, wherein said processing unit configured to improve the maximum operating frequency by finding the first shift register implemented within the first RAM block, said processing unit configured to verify that the first shift register has a shift register function upon finding the first shift register.

21. A system in accordance with claim 20, wherein said processing unit configured to find the first shift register by:
  determining whether the first RAM block has an address input driven by a primary input set to a particular value;
  determining that the first RAM block has a probability of including the first shift register upon determining that the first RAM block has the address input not driven by the primary input;
  marking the first RAM block to be in a first set;
  marking the address input to be in the first set.

* * * * *